US010277185B2

(12) United States Patent
Hayashi et al.

(10) Patent No.: US 10,277,185 B2
(45) Date of Patent: Apr. 30, 2019

(54) COMMUNICATION SYSTEM AND ROBOT

(71) Applicant: TOYOTA JIDOSHA KABUSHIKI KAISHA, Toyota-shi (JP)

(72) Inventors: Hironao Hayashi, Motosu-gun (JP); Takuya Iwata, Toyota (JP)

(73) Assignee: TOYOTA JIDOSHA KABUSHIKI KAISHA, Toyota-shi (JP)

( * ) Notice: Subject to any disclaimer, the term of this patent is extended or adjusted under 35 U.S.C. 154(b) by 0 days.

(21) Appl. No.: 14/769,971

(22) PCT Filed: Mar. 7, 2014

(86) PCT No.: PCT/JP2014/001299
§ 371 (c)(1),
(2) Date: Aug. 24, 2015

(87) PCT Pub. No.: WO2014/147989
PCT Pub. Date: Sep. 25, 2014

(65) Prior Publication Data
US 2015/0381132 A1 Dec. 31, 2015

(30) Foreign Application Priority Data

Mar. 22, 2013 (JP) .................................. 2013-059420

(51) Int. Cl.
*H03G 5/00* (2006.01)
*H03G 3/32* (2006.01)
(Continued)

(52) U.S. Cl.
CPC ................. *H03G 3/32* (2013.01); *A63H 3/28* (2013.01); *A63H 11/00* (2013.01); *A63H 13/00* (2013.01);
(Continued)

(58) Field of Classification Search
CPC .. H04M 9/082; H04M 2250/62; H04R 1/406; H04R 3/005; H03G 3/342; H04N 7/15; A47B 2200/0079
(Continued)

(56) References Cited

U.S. PATENT DOCUMENTS

2006/0013416 A1* 1/2006 Truong ................. H04M 3/568
381/119
2007/0274531 A1* 11/2007 Camp ...................... H04R 5/04
381/74
(Continued)

FOREIGN PATENT DOCUMENTS

| CN | 102547459 A | 7/2012 |
|----|-------------|--------|
| JP | 8-318052 A  | 12/1996 |

(Continued)

OTHER PUBLICATIONS

International Search Report dated May 27, 2014 in PCT/JP14/001299 Filed Mar. 7, 2014.

*Primary Examiner* — George C Monikang
(74) *Attorney, Agent, or Firm* — Oblon, McClelland, Maier & Neustadt, L.L.P.

(57) ABSTRACT

A communication system includes a first microphone, a first loudspeaker, a second loudspeaker, a second microphone, a speaker number determination unit, and a control unit. The first microphone acquires a surrounding voice as a voice signal. The first loudspeaker is provided near the first microphone and outputs a voice. The second loudspeaker acquires the voice signal from the first microphone and outputs the voice signal as a voice. The second microphone acquires a surrounding voice as a voice signal and outputs the voice signal to the first loudspeaker. The speaker number determination unit determines the number of speakers around the first microphone based on the voice signal acquired by the first microphone. The control unit controls
(Continued)

a volume of the first loudspeaker based on the determination of the speaker number determination unit.

12 Claims, 14 Drawing Sheets

(51) Int. Cl.
    *A63H 11/00*     (2006.01)
    *A63H 3/28*     (2006.01)
    *A63H 13/00*     (2006.01)
    *G10L 21/0316*     (2013.01)
    *G10L 25/48*     (2013.01)

(52) U.S. Cl.
    CPC .......... *G10L 21/0316* (2013.01); *G10L 25/48* (2013.01); *A63H 2200/00* (2013.01)

(58) Field of Classification Search
    USPC .......................................... 381/122, 104–105
    See application file for complete search history.

(56) References Cited

U.S. PATENT DOCUMENTS

| | | | | |
|---|---|---|---|---|
| 2010/0019715 A1* | 1/2010 | Roe | ........................ | B25J 9/0003 |
| | | | | 318/568.12 |
| 2010/0189275 A1* | 7/2010 | Christoph | .............. | H04R 3/005 |
| | | | | 381/66 |
| 2012/0092167 A1* | 4/2012 | Hohl | ....................... | G06F 3/017 |
| | | | | 340/573.1 |

FOREIGN PATENT DOCUMENTS

| | | |
|---|---|---|
| JP | 2003-235019 A | 8/2003 |
| JP | 2007-60460 A | 3/2007 |
| JP | 2007-118129 A | 5/2007 |

* cited by examiner

COMMUNICATION SYSTEM AND ROBOT

TECHNICAL FIELD

The present invention relates to a communication system, a robot, a volume control method, and a robot control program.

BACKGROUND ART

In recent years, robots have been located in places with people around (for example, in conference rooms) and are caused to execute communication with people. For example, Patent Literature 1 discloses a technique for a communication robot that detects the number of people around a robot. This communication robot provides various notices to the people around the robot by using a loudspeaker according to the detected number of people.

CITATION LIST

Patent Literature

[Patent Literature 1] Japanese Unexamined Patent Application Publication No. 2007-118129

SUMMARY OF INVENTION

Technical Problem

When a robot executes communication with people as mentioned above, there is a problem that the robot (or a person who remote-controls the robot if the robot is a remote-controlled robot) has difficulty in fully recognizing the state of a conversation had by people around the robot. Specifically, it has been difficult for the robot, or the person who controls the robot, to recognize the state of people around the robot, such as a state where the people are currently having a conversation, or a state where the people are quietly listening to a speech or the like made by any other person. As a result, when the people around the robot are quietly listening to someone's speech, for example, the robot may execute an operation to raise its voice. In this manner, the behavior of the robot may ruin the ambient atmosphere.

The present invention has been made to solve the above-mentioned problem, and an object of the present invention is to provide a communication system, a robot, a volume control method, and a robot control program which are capable of changing a sound volume of communication depending on the surrounding environment.

Solution to Problem

A communication system according to the present invention includes a first microphone, a first loudspeaker, a second loudspeaker, a second microphone, a speaker number determination unit, and a control unit. The first microphone acquires a surrounding voice as a voice signal. The first loudspeaker is provided near the first microphone and outputs a voice. The second loudspeaker acquires the voice signal from the first microphone and outputs the voice signal as a voice. The second microphone acquires a surrounding voice as a voice signal and outputs the acquired voice signal to the first loudspeaker. The speaker number determination unit determines the number of speakers around the first microphone based on the voice signal acquired by the first microphone. The control unit controls a volume of the first loudspeaker based on the determination of the speaker number determination unit. With this configuration, the communication system can control the volume of the first loudspeaker according to the number of speakers around the first microphone. Accordingly, the communication system can change the sound volume of communication depending on the environment around the first microphone.

When the speaker number is less than a threshold, the control unit may control the volume of the first loudspeaker to be lower than that when the speaker number is equal to or more than the threshold. With this configuration, when the number of speakers around the first microphone is less than the threshold, the volume of the voice output from the first loudspeaker near the first microphone is turned down. Accordingly, the communication system can prevent a speech being made around the first loudspeaker from being disturbed.

When the speaker number is less than the threshold, the control unit may control the volume of the first loudspeaker to be maintained at a low level even when the speaker number becomes equal to or more than the threshold only for a time period less than a predetermined time period. With this configuration, the control unit can control the volume of the first loudspeaker to be maintained at a low level, even in a case where a number of people speak only for a short period of time when a speech is made around the first microphone. Thus, the communication system can prevent a speech being made around the first loudspeaker from being disturbed.

When the speaker number is equal to or more than the threshold, the control unit may control the volume of the first loudspeaker to be maintained at a high level even when the speaker number becomes less than the threshold only for a time period less than a predetermined time period. With this configuration, the control unit can control the volume of the first loudspeaker to be maintained even when people are silent for only a short period of time in a case where a number of people have a conversation around the first microphone. Thus, the communication system prevents the communication of people having a conversation using the second loudspeaker and the second microphone from being disturbed by turning down the volume of the first loudspeaker.

The control unit may control the volume of the first loudspeaker to be turned down when the speaker number decreases by more than a predetermined number within a specific time period. With this configuration, the control unit can detect that the surrounding state of the first microphone has changed from a state where a number of people are having a conversation to a state where the audience is quietly waiting for a speech to start, and can turn down the volume of the first loudspeaker. Thus, the communication system can prevent a speech being made around the first loudspeaker from being disturbed.

The control unit may control the volume of the first loudspeaker to be turned down when the speaker number is equal to or less than the threshold and is decreasing. With this configuration, the control unit can detect that the surrounding state of the first microphone is a state where the audience is quietly waiting for a speech to start, and can turn down the volume of the first loudspeaker. Thus, the communication system can prevent a speech being made around the first loudspeaker from being disturbed.

The communication system may further include a comparison unit that outputs a result of a comparison between a loudness of a voice acquired by the first microphone and a loudness of a voice acquired by the second microphone. The control unit may control the volume of the first loudspeaker based on the result of the comparison by the comparison unit. Thus, the communication system can control the volume of the first loudspeaker depending on the loudness of the voice around the first loudspeaker.

The control unit may control the volume of the first loudspeaker based on the speaker number within a certain period of time. Accordingly, even when the speaker number changes only for a short period of time, the control unit can accurately determine the surrounding state of the microphone, regardless of a change in the state. The communication system can change the sound volume of communication with high accuracy depending on the environment around the first microphone.

The speaker number determination unit may count, as the speaker number within a certain period of time, the number of individuals who have a conversation within the certain period of time. With this configuration, the speaker number determination unit can accurately recognize the total number of people having a conversation in a case where different people have a conversation at different times. Accordingly, the control unit can accurately determine the surrounding state of the first microphone. Therefore, the communication system can change the sound volume of communication with high accuracy depending on the environment around the first microphone.

A robot according to the present invention is a robot that executes communication with a human by using a voice. The robot includes a loudspeaker, a microphone, a speaker number determination unit, and a control unit. The loudspeaker outputs a voice. The microphone acquires a voice around the robot as a voice signal. The speaker number determination unit determines the number of speakers around the robot based on the voice signal acquired by the microphone. The control unit controls a volume of the loudspeaker based on the determination of the speaker number determination unit. With this configuration, the robot can control the volume of the loudspeaker according to the number of speakers around the robot. Accordingly, the robot can change the sound volume of communication depending on the surrounding environment.

A volume control method according to the present invention is a volume control method for a communication system, the communication system including: a first microphone that acquires a surrounding voice as a voice signal; a first loudspeaker that is provided near the first microphone and outputs a voice; a second loudspeaker that acquires the voice signal from the first microphone and outputs the acquired voice signal as a voice; and a second microphone that acquires a surrounding voice as a voice signal and outputs the acquired voice signal to the first loudspeaker. The volume control method includes at least the following steps:

(a) determining the number of speakers around the first microphone based on the voice signal acquired by the first microphone; and (b) controlling a volume of the first loudspeaker based on the determination.

With this configuration, the communication system can control the volume of the first loudspeaker according to the number of speakers around the first microphone. Accordingly, the communication system can change the sound volume of communication depending on the environment around the first microphone.

A robot control program according to the present invention is a control program for a robot including: a loudspeaker that outputs a voice; and a microphone that acquires a surrounding voice as a voice signal. The robot control program causes the robot to execute at least the following steps:

(a) determining the number of speakers around the robot based on the voice signal acquired by the microphone; and (b) controlling a volume of the loudspeaker based on the determination. With this configuration, the robot can control the volume of the loudspeaker according to the number of speakers around the robot. Accordingly, the robot can change the sound volume of communication depending on the surrounding environment.

Advantageous Effects of Invention

According to the present invention, it is possible to provide a communication system, a robot, a volume control method, and a robot control program which are capable of changing a sound volume of communication depending on the surrounding environment.

DESCRIPTION OF EMBODIMENTS

First Embodiment

Figure 1:
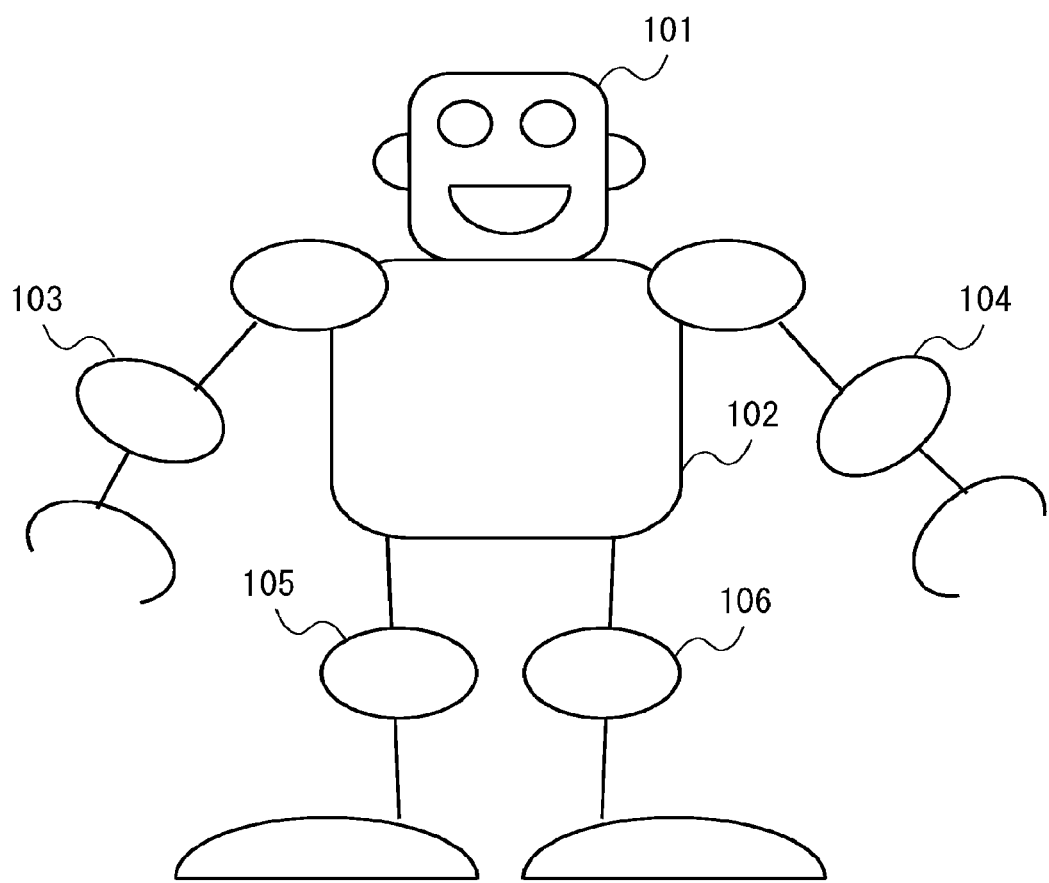
FIG. 1 is a diagram showing an example of an appearance of a robot according to a first embodiment.

A first embodiment of the present invention will be described below with reference to the drawings. FIG. 1 is a diagram showing an example of an appearance of a robot 100 according to the first embodiment. The robot 100 is a remote-controlled robot that is formed in the shape of a human. The robot 100 includes a head 101, a body part 102, a right arm part 103, a left arm part 104, a right leg part 105, and a left leg part 106. Each part of the robot 100 can be moved by a remote control.

Figure 2:
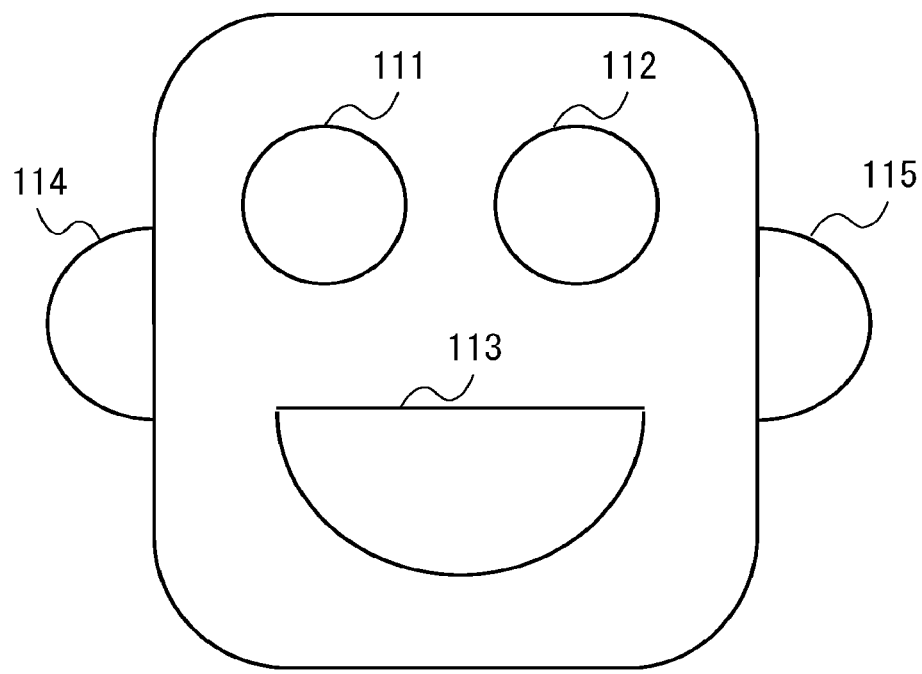
FIG. 2 is a diagram showing a configuration example of a head of the robot according to the first embodiment.

FIG. 2 is a diagram showing a configuration example of the head 101. The head 101 includes a right eye 111, a left eye 112, a mouth 113, a right ear 114, and a left ear 115. The right eye 111 and the left eye 112 are provided at locations respectively corresponding to the right and left eyes of a human face. The right eye 111 functions as a camera. The robot 100 can take images of a surrounding environment with the camera and transmit photographing data to a person who remote-controls the robot (the person is hereinafter referred to as a remote operator). The remote operator can view the environment around the robot 100 by viewing the photographing data as a video.

The mouth 113 is provided at a location corresponding to the mouth of a human face. A loudspeaker is provided at the mouth 113. The robot 100 can use the loudspeaker, which is provided at the mouth 113, to reproduce a voice signal, which is transmitted from a remote control side, as a voice so that people around the robot 100 can hear the voice.

The right ear 114 and the left ear 115 are provided at locations respectively corresponding to the right and left ears of a human face. A microphone is provided at the right ear 114. The robot 100 can acquire surrounding sounds (for example, a conversation had by a person around the robot 100) by using the microphone, and can transmit the acquired surrounding sounds to the remote operator as voice data which is an electric signal. The remote operator listens to the voice data as a voice from the loudspeaker, so that the remote operator can confirm the sounds around the robot 100. The people around the robot 100 are, for example, people located within a radius of a few meters from the robot 100.

Figure 3:
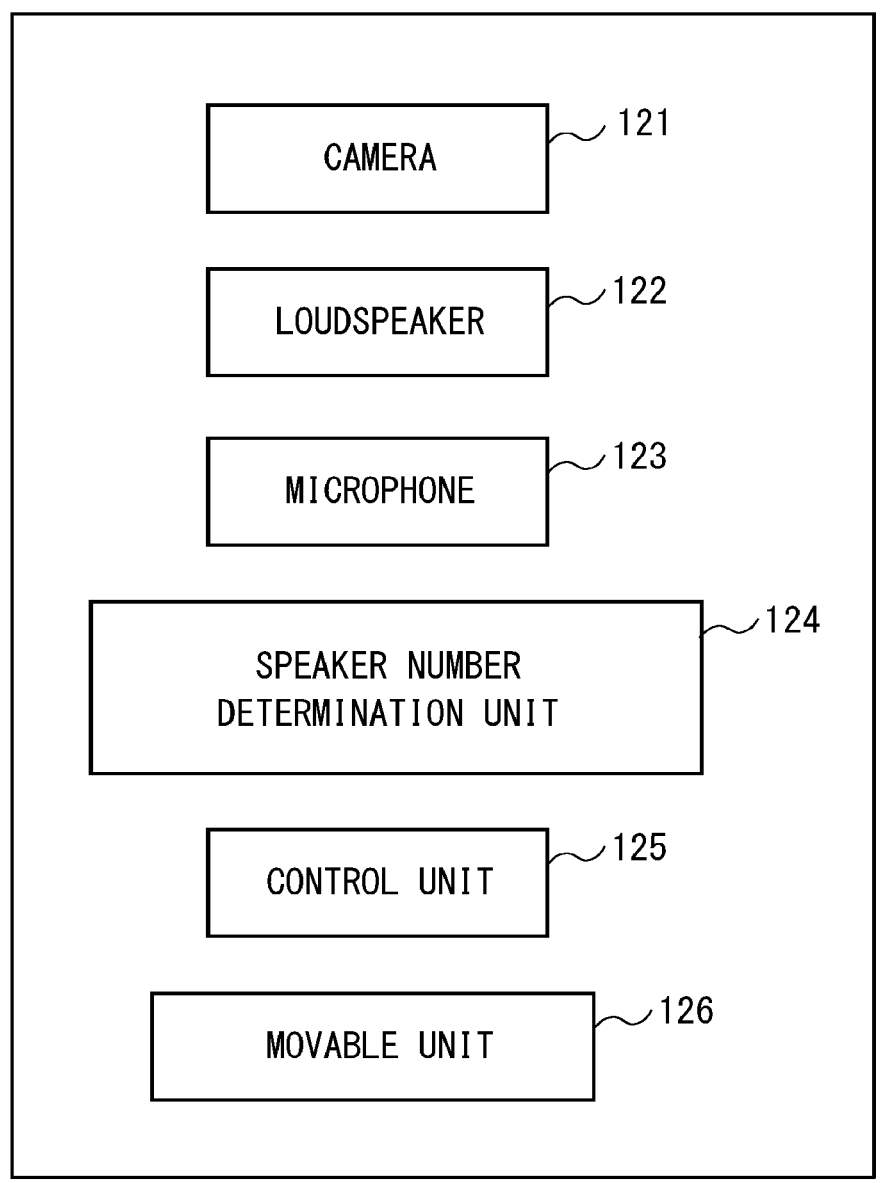
FIG. 3 is a block diagram showing an example of internal components of the robot according to the first embodiment.

FIG. 3 is a block diagram showing an example of internal components of the robot 100. The robot 100 includes a camera 121, a loudspeaker 122, a microphone 123, a speaker number determination unit 124, a control unit 125, and a movable unit 126. The camera 121 is identical with the above-mentioned camera which is provided at the right eye 111. The loudspeaker 122 is identical with the above-mentioned loudspeaker which is provided at the mouth 113. The microphone 123 is identical with the above-mentioned microphone which is provided at the right ear 114.

The speaker number determination unit 124 determines the number of speakers who are talking around the robot 100, based on the surrounding sounds acquired from the microphone 123. This process will be described in detail later.

The control unit 125 controls each part of the robot 100 according to a control signal from the remote control side. The control unit 125 is, for example, an IC (Integrated Circuit) that is composed of a CPU (Central Processing Unit), a memory, and other circuits. The control unit 125 can adjust, for example, the volume of the loudspeaker 122 according to the control signal. The movable unit 126 is a unit that allows the components from the head 101 to the left leg part 106 to move under the control of the control unit 125. The movable unit 126 is, for example, an actuator.

Figure 4:
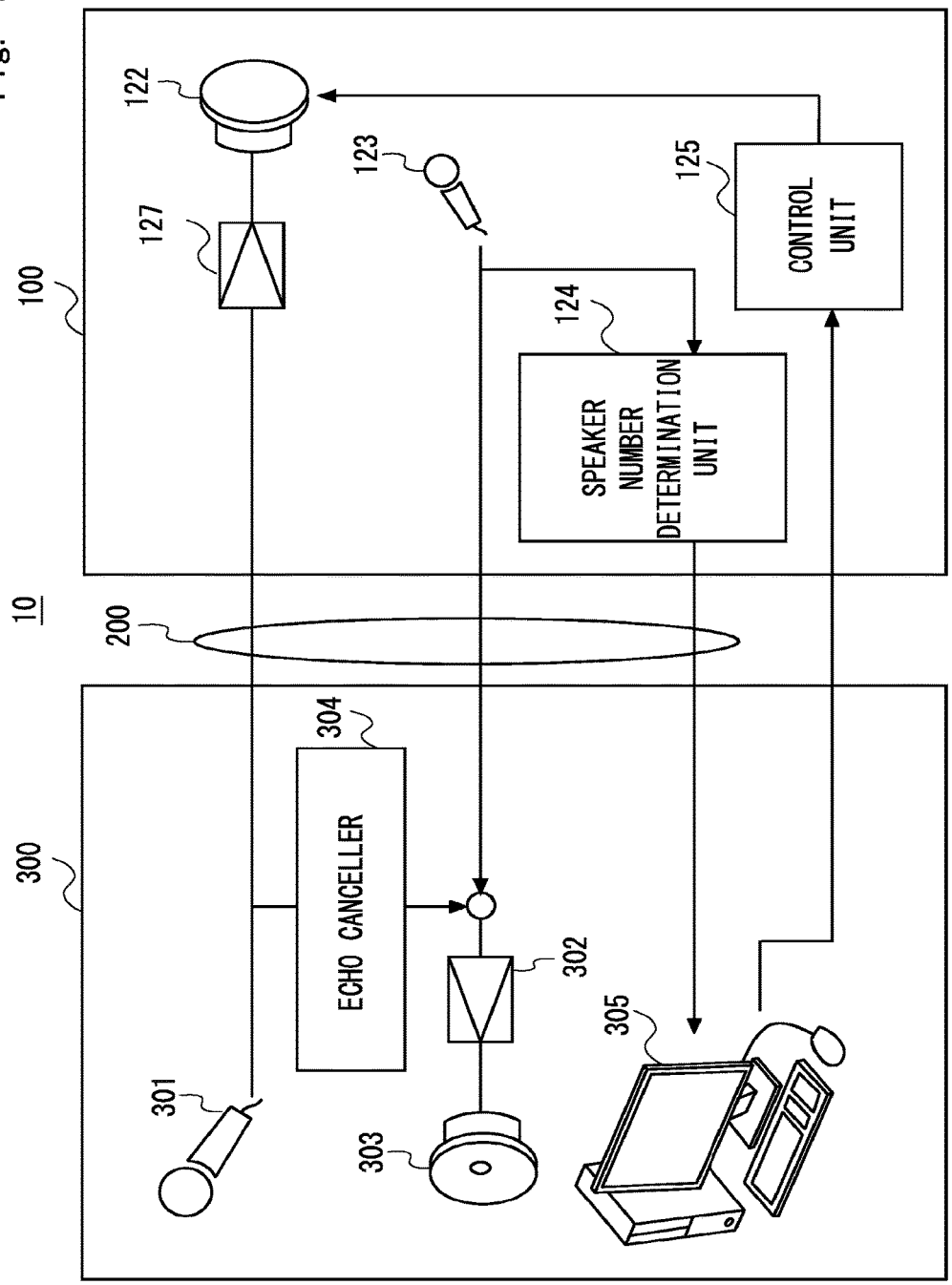
FIG. 4 is a configuration diagram showing an example of a communication system including the robot according to the first embodiment.

FIG. 4 is a configuration diagram showing an example of a communication system including the robot 100 having the configuration described above. As shown in FIG. 4, a communication system 10 includes the robot 100, a network 200, and a remote control side 300, and the robot 100 is connected to the remote control side 300 via the network 200.

FIG. 4 shows an amplifier 127 as well as the loudspeaker 122 (first loudspeaker), the microphone 123 (first microphone), the speaker number determination unit 124, and the control unit 125, as the components of the robot 100. The amplifier 127 amplifies the voice signal from the remote control side 300 and supplies the amplified voice signal to the loudspeaker 122. The robot 100 also includes the components shown in FIGS. 1 to 3, but the illustration of these components is omitted in FIG. 4.

The network 200 is a wired or wireless network. The remote control side 300 is a location where the remote operator of the robot 100 executes the remote control thereof. The remote control side 300 includes a microphone 301 (second microphone), an amplifier 302, a loudspeaker 303 (second loudspeaker), an echo canceller 304, and a control terminal 305.

Each part of the remote control side 300 will be described below. The microphone 301 is connected to the loudspeaker 122 via the network 200. When the remote operator inputs his/her own voice to the microphone 301, the voice is converted into an electric signal, and the electric signal is delivered to the loudspeaker 122 via the network 200 and the amplifier 127. As described above, the loudspeaker 122 converts the voice signal into a voice and outputs the voice. Thus, the remote operator can output his/her own voice from the robot 100 which is far away from the remote operator.

The amplifier 302 acquires the voice signal, which is output from the microphone 123, via the network 200, amplifies the voice signal, and outputs the amplified voice signal to the loudspeaker 303. The loudspeaker 303 converts the voice signal into a voice and outputs the voice. Thus, the remote operator can hear the sounds around the robot 100.

The echo canceller 304 is a unit that cancels echoes generated by the loudspeaker 122, the microphone 123, the microphone 301, and the loudspeaker 303. The echo canceller 304 is provided between a connecting wire that connects the microphone 301 and the loudspeaker 122 to each other and a connecting wire that connects the amplifier 302 and the microphone 123 to each other.

The remote operator inputs his/her own voice from the microphone 301, and the voice is output from the loudspeaker 122. At this time, if the voice is input from the microphone 123, the voice is output from the loudspeaker 303. In other words, an echo occurs. In order to prevent the occurrence of the echo, the echo canceller 304 detects, from the connecting wire, the voice signal from the remote operator that is output to the microphone 301, and outputs a cancel signal for cancelling the voice signal to the connecting wire that connects the amplifier 302 and the microphone 123 to each other. Thus, the echo canceller 304 can prevent the occurrence of the echo. The control terminal 305 (control unit) acquires a determination result, which is output from the speaker number determination unit 124, and executes the control of the robot 100 based on the determination result. For example, the control terminal 305 can automatically control the volume of the loudspeaker 122 of the robot 100. This control will be described in detail below.

Figure 5:
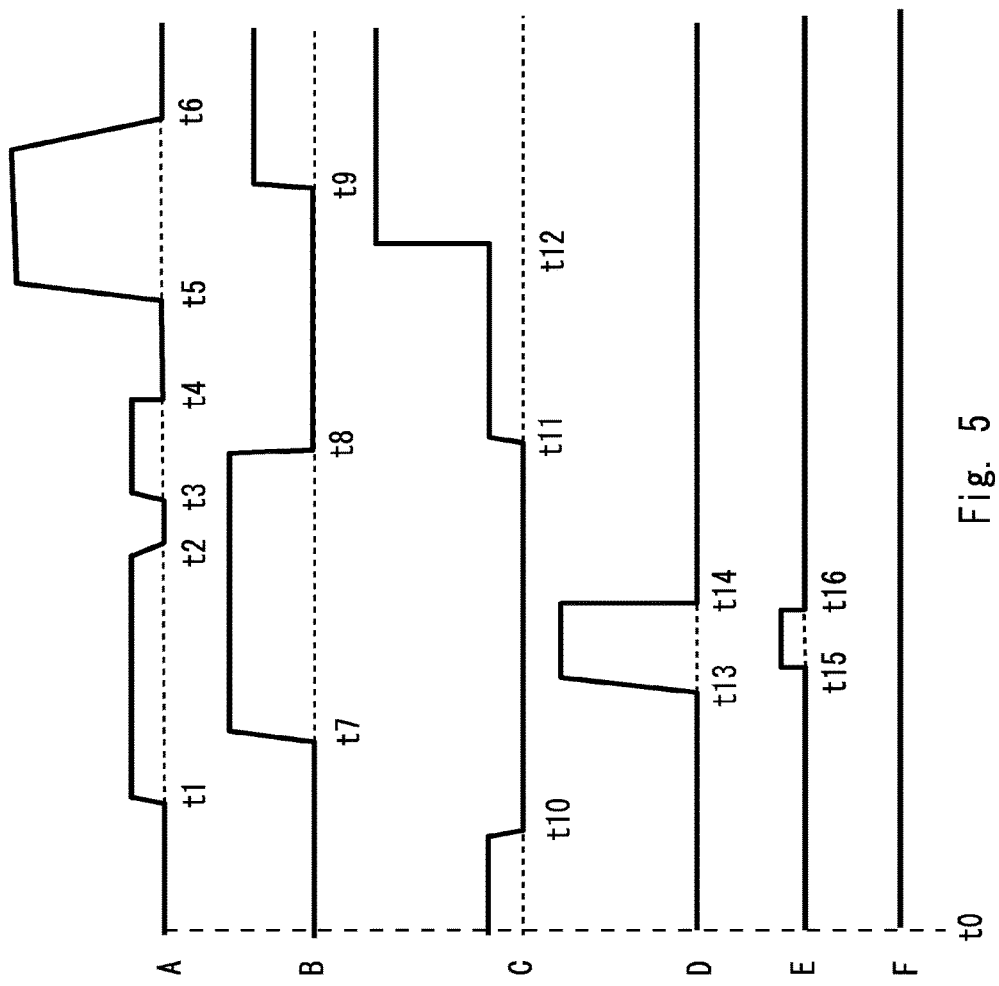
FIG. 5 is a graph showing an example of the loudness of speaking voices of people around the robot according to the first embodiment.

FIG. 5 is a graph showing an example of the loudness of speaking voices of people around the robot 100. FIG. 5 is based on the premise that six persons A to F are around the robot 100. In FIG. 5, the horizontal axis represents time and the vertical axis represents the loudness of a speaking voice. In FIG. 5, t0 represents an initial time.

Referring to FIG. 5, the person A is silent during a period from the time t0 to a time t1, is speaking in a small voice during a period from the time t1 to a time t2 is silent during a period from the time t2 to a time t3, is speaking in a small voice during a period from the time t3 to a time t4, is silent during a period from the time t4 to a time t5, is speaking in a loud voice during a period from the time t5 to a time t6, and is silent after the time t6. The person B is silent during a period from the time t0 to a time t7, is speaking in a medium voice during a period from the time t7 to a time t8, is silent during a period from the time t8 to a time t9, and is speaking in a medium voice after the time t9. The person C is speaking in a small voice during a period from the time t0 to a time t10, is silent during a period from the time t10 to a time t11, is speaking in a small voice during a period from the time t11 to a time t12, and is speaking in a loud voice after the time t12. The person D is silent during a period from the time t0 to a time t13, is speaking in a loud voice during a period from the time t13 to a time t14, and is silent after the time t14. The person E is silent during a period from the time t0 to a time t15, is speaking in a small voice during a period from the time t15 to a time t16, and is silent after the time t16. The person F is silent from the time t0. In this manner, people's speaking voices include a loud voice and a small voice, and during a long span of time, the people's voices are intermittent, not continuous. The microphone 123 acquires such speaking voices as voice data.

The voice data acquired by the microphone 123 is input to the loudspeaker 303 via the network 200 and the amplifier 302. The voice data acquired by the microphone 123 is input to the speaker number determination unit 124.

The speaker number determination unit 124 determines the number of people (speakers) who are currently having a conversation, based on the voice data acquired by the microphone 123. Human voices have different characteristic vibrations of their vocal cords. Accordingly, even when two or more people speak at the same time, the speaker number determination unit 124 analyzes the voice data to thereby detect two or more different characteristic vibrations. Thus, the speaker number determination unit 124 determines that two or more people are speaking. In this manner, the speaker number determination unit 124 determines the speaker number indicating the number of speakers around the microphone 123.

Figure 6:
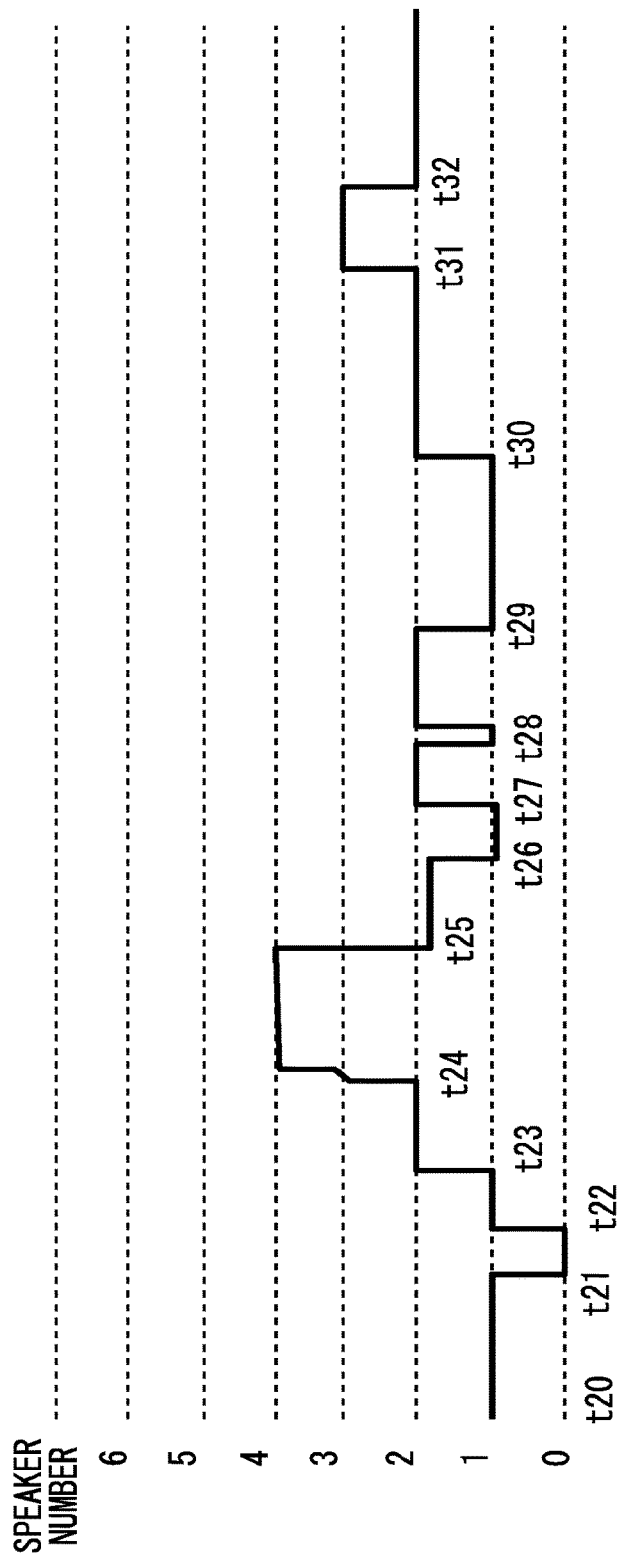
FIG. 6 is an example of a graph showing a speaker number determined by a speaker number determination unit according to the first embodiment.

FIG. 6 is an example of a graph showing the speaker number determined by the speaker number determination unit 124. In FIG. 6, the horizontal axis represents time and the vertical axis represents the speaker number at a specific time. Referring to FIG. 6, at an initial time t20, the number of speakers around the microphone 123 (i.e., around the robot 100) is one. At a time t21, the speaker number decreases to zero. At a time t22, the speaker number increases to one. At a time t23, the speaker number increases to two. At a time t24, the speaker number is three, and immediately after that, the speaker number increases to four. At a time t25, the speaker number decreases to two. At a time t26, the speaker number is one. At a time t27, the speaker number increases to two. At a time t28, the speaker number is temporarily one, but immediately after that, the speaker number increases to two. At a time t29, the speaker number is one. At a time t30, the speaker number increases to two. At a time t31, the speaker number is three. At a time t32, the speaker number is two.

In the manner as described above, the speaker number determination unit 124 determines the number of speakers around the microphone 123. The speaker number determination unit 124 outputs the speaker number to the control terminal 305 via the network 200. The control terminal 305 controls the volume of the loudspeaker 122 based on the determination result.

Further, the speaker number determination unit 124 calculates a simple moving average of the number of speakers around the robot (hereinafter referred to as a moving average speaker number) based on the previous number of speakers around the microphone 123 within a certain period of time and the current number of speakers around the current microphone 123, both of which are determined by the speaker number determination unit 124. The speaker number determination unit 124 also outputs the data indicating the moving average speaker number as the determination result to the control terminal 305.

In the following description, the control terminal 305 automatically sets the volume of the loudspeaker 122 based on a program, and outputs a control signal for controlling the volume of the loudspeaker 122, thereby controlling the volume of the loudspeaker 122. In this case, however, the remote operator may operate the control terminal 305 based on the determination result displayed on the control terminal 305, to thereby control the volume of the loudspeaker 122. Specifically, the control terminal 305 outputs, to the control unit 125, a control signal for controlling the volume of the loudspeaker 122, and the control unit 125 controls the volume of the loudspeaker 122 according to the control signal. Accordingly, the remote operator can control the volume of the loudspeaker 122.

In this case, the speaker number determination unit 124 counts, in the voices acquired by the microphone 123, the number of people who speak in a voice volume equal to or higher than a certain level, as the speaker number, while the speaker number determination unit 124 does not count, as the speaker number, the number of people who speak in a voice volume lower than a certain level. The term "people who speak in a voice volume equal to or higher than a certain level" refers to people who are having a conversation with a normal inter-personal distance, and the term "people who speak in a voice volume lower than a certain level" refers to people who are having a conversation in a small voice, such as a whispering voice. Assuming that a threshold for a sound pressure level is 55 dB, for example, the speaker number determination unit 124 counts, as the speaker number, the number of people who speak in a voice volume equal to or higher than the threshold, thereby counting, as the speaker number, only the number of people who speak in a voice volume equal to or higher than a certain level. The sound pressure level of a normal conversation is about 60 dB, while the sound pressure level of a whispering voice is 30 to 40 dB. Accordingly, when the threshold for the sound pressure level is set to 55 dB, only the number of people who are having a normal conversation can be counted as the speaker number. Note that any other value, such as 50 dB or 40 dB, may be set as the threshold for the sound pressure level.

The control terminal 305 classifies the surrounding states into the following three states based on the set threshold and the moving average speaker number calculated by the speaker number determination unit 124. The three states are:

a. A state where a number of people are having a conversation;
b. A state where people are relatively quietly waiting for a speech being made by someone (speech waiting state); and
c. A state where a specific person is making a speech, or is about to make a speech.

Details of the three states will be described below.

In the control terminal 305, 1.5 is set as a first threshold R1; 2.5 is set as a second threshold R1'; 3.5 is set as a third threshold R2; and 4.5 is set as a fourth threshold R2', as thresholds for the number of speakers around the microphone 123. The magnitude relation among the first to fourth thresholds R1 to R2' is expressed as R1<R1'<R2<R2'.

A fifth threshold R3 and a sixth threshold R3' (R3 and R3' are certain negative values) are set as thresholds for an inclination $\alpha$ (differential value) of the moving average speaker number at a certain time. Each of the first threshold R1, the second threshold R1', and the fifth threshold R3 is a threshold for the control terminal 305 to determine whether the surrounding state is the state where a specific person is making a speech, for example, or the speech waiting state. Each of the third threshold R2, the fourth threshold R2', and the sixth threshold R3' is a threshold for the control terminal 305 to determine whether the surrounding state is the state where a number of people are having a conversation, or the speech waiting state. A specific example of the determination of the control terminal 305 will be described below.

When the moving average speaker number calculated by the speaker number determination unit 124 is equal to or more than the third threshold R2 (i.e., when the moving average speaker number is equal to or more than 3.5), the control terminal 305 determines, in principle, that the surrounding state is the state (state "a") where a number of people are having a conversation. This is because, since not a small number of people are having a conversation, the surrounding state is regarded not as the state where a speech or the like is being made, but as the state where people are having a conversation.

However, even if the moving average speaker number is equal to or more than the third threshold R2, the control terminal 305 determines the surrounding state to be the state "b" when the moving average speaker number is less than the fourth threshold R2' and the inclination $\alpha$ (differential value) of the moving average speaker number at a certain time is less than the sixth threshold R3'. In other words, the control terminal 305 determines that the surrounding state has abruptly shifted from the state where a number of people are having a conversation to the speech waiting state. In this case, the sixth threshold R3' is a value that indicates that when the moving average speaker number is less than the fourth threshold R2', the moving average speaker number decreases to less than the third threshold R2 within a specific time period (for example, within three seconds) as the moving average speaker number decreases by the sixth threshold R3' of the inclination.

When the moving average speaker number calculated by the speaker number determination unit 124 is equal to or more than the first threshold R1 and less than the third threshold R2, the control terminal 305 determines, in principle, that the surrounding state is the state (state "b") where people are quietly waiting for someone to start speaking. The surrounding state is the state where a small number of people are having a conversation. The surrounding state is neither the state where a specific person is making a speech, or is about to make a speech, nor the state where people around the robot feel free to have a conversation. Accordingly, it is appropriate to consider that the surrounding state is the state where a small number of people around the robot are having a conversation, while waiting for a speech or the like to start.

However, even if the moving average speaker number is equal to or more than the first threshold R1, the control terminal 305 determines the surrounding state to be the state "c" when the moving average speaker number is less than the second threshold R1' and the inclination $\alpha$ of the moving average speaker number at a certain time is less than the fifth threshold R3. In other words, the control terminal 305 determines that the surrounding state has abruptly shifted from the speech waiting state to the state where a specific person is making a speech, for example. In this case, the fifth threshold R3 is a value that indicates that when the moving average speaker number is less than the second threshold R1', the moving average speaker number decreases to less than the first threshold R1 within a specific time period as the moving average speaker number decreases by the fifth threshold R3 of the inclination.

When the moving average speaker number calculated by the speaker number determination unit 124 is less than the first threshold R1, the control terminal 305 determines the surrounding state to be the state (state "c") where a specific person is making a speech, or is about to make a speech. This is because when the number of speakers around the microphone 123 is one, it is considered that the people around the microphone 123 are not making any conversation, but instead a speech, such as a congratulatory speech, an address, or a lecture, is presented to the audience. It is also considered that when the number of speakers around the robot is zero, the people around the microphone 123 are not making any conversation because they are waiting for a speech to start.

In summary, the control terminal 305 determines the surrounding state of the microphone 123 to be one of the above-mentioned states "a", "b", and "c" in the following manner. When the moving average speaker number is equal to or more than the third threshold R2, the control terminal 305 determines, in principle, the surrounding state of the microphone 123 to be the state "a". However, when the moving average speaker number is less than the fourth threshold R2' and is equal to or more than the third threshold R2 and when the inclination of the moving average speaker number is less than the sixth threshold R3', the control terminal 305 determines the surrounding state of the microphone 123 to be the state "b". When the moving average speaker number is less than the third threshold R2 and is equal to or more than the first threshold R1, the control terminal 305 determines, in principle, the surrounding state of the microphone 123 to be the state "b". However, when the moving average speaker number is less than the second threshold R1' and is equal to or more than the first threshold R1 and when the inclination of the moving average speaker number is less than the fifth threshold R3, the control terminal 305 determines the surrounding state of the microphone 123 to be the state "c" When the moving average speaker number is less than the first threshold R1, the control terminal 305 determines the surrounding state of the microphone 123 to be the state "c".

Figure 7:
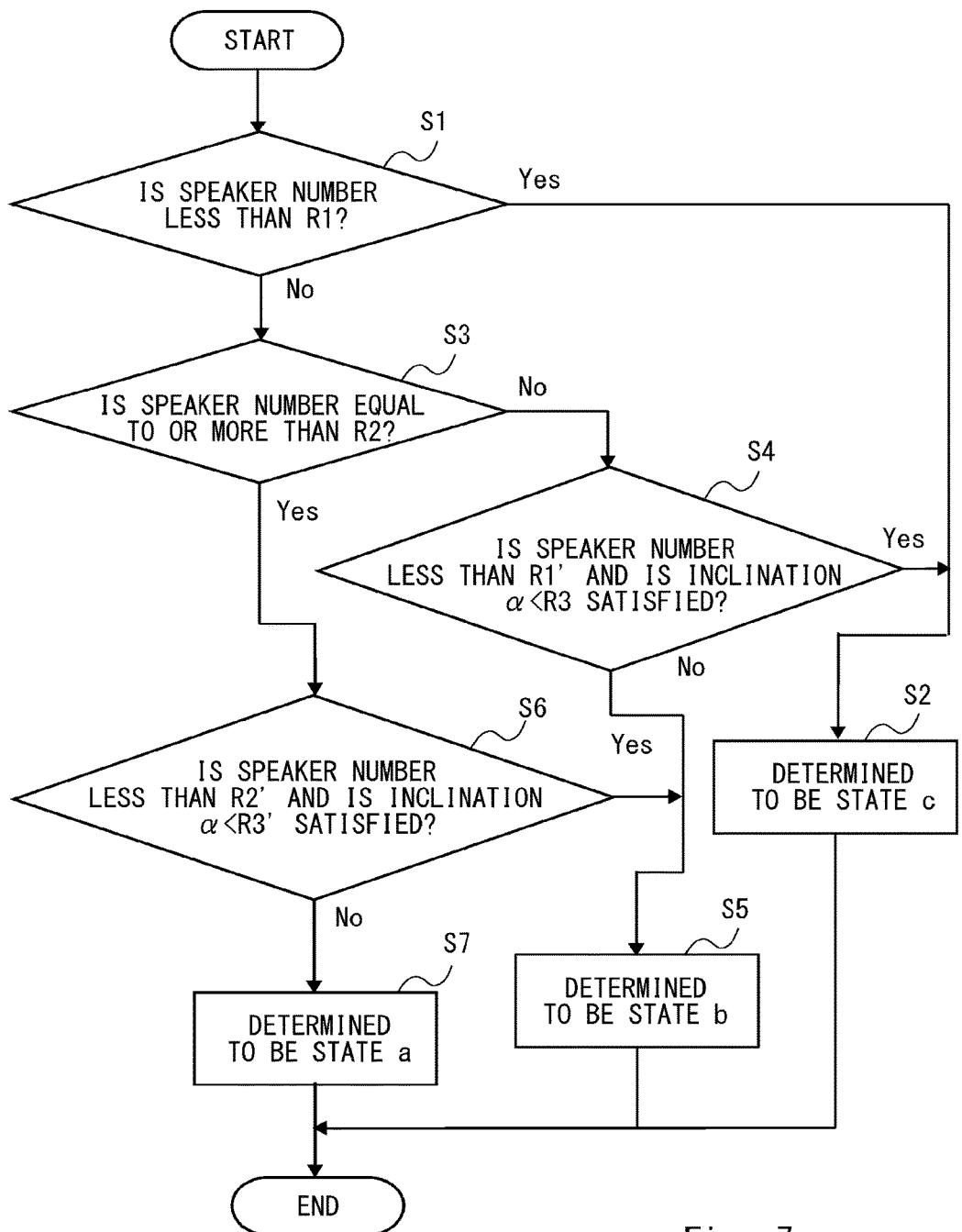
FIG. 7 is a flowchart showing an example of a state determination process in a control terminal according to the first embodiment.

FIG. 7 is a flowchart showing an example of a state determination process in the control terminal 305 at a specific time. An example of the state determination process in the control terminal 305 will be described below.

The control terminal 305 first determines whether the moving average speaker number is less than the first threshold R1 (step S1). When the moving average speaker number is less than the first threshold R1 (Yes in step S1), the control terminal 305 determines the surrounding state of the microphone 123 to be the state "c" (step S2).

When the moving average speaker number is equal to or more than the first threshold R1 (No in step S1), the control terminal 305 determines whether the moving average speaker number is equal to or more than the third threshold R2 (step S3).

When the moving average speaker number is less than the third threshold R2 (No in step S3), the control terminal 305 further determines whether the moving average speaker number is less than the second threshold R1' and whether the inclination α of the moving average speaker number is less than the fifth threshold R3 (step S4).

When the moving average speaker number is less than the second threshold R1' and the inclination α of the moving average speaker number is less than the fifth threshold R3 (Yes in step S4), the control terminal 305 determines the surrounding state of the microphone 123 to be the state "c" (step S2).

When the moving average speaker number is equal to or more than the second threshold R1' or when the inclination α of the moving average speaker number is equal to or more than the fifth threshold R3 (No in step S4), the control terminal 305 determines the surrounding state of the microphone 123 to be the state "b" (step S5).

By returning back to the determination process in step S3, the description will be continued. When the moving average speaker number is equal to or more than the third threshold R2 (Yes in step S3), the control terminal 305 further determines whether the moving average speaker number is less than the third threshold R2' and whether the inclination α of the moving average speaker number is less than the sixth threshold R3' (step S6).

When the moving average speaker number is less than the third threshold R2' and when the inclination α of the moving average speaker number is less than the sixth threshold R3' (Yes in step S6), the control terminal 305 determines the surrounding state of the microphone 123 to be the state "b" (step S5).

When the moving average speaker number is equal to or more than the third threshold R2' or when the inclination α of the moving average speaker number is equal to or more than the sixth threshold R3' (No in step S6), the control terminal 305 determines the surrounding state of the microphone 123 to be the state "a" (step S7).

Even in a state where the magnitude relation between the moving average speaker number calculated by the speaker number determination unit 124 and the threshold R1 or R2 has changed, the control terminal 305 does not regard that the surrounding state has changed, unless such a state continues for a period of time longer than a predetermined time period T. In other words, even in a state where the surrounding state is regarded to have changed for a period of time less than the predetermined time period T, the control terminal 305 does not determine that the surrounding state has changed. This is a measure to prevent the control terminal 305 from determining that the surrounding state has changed, despite the fact that the surrounding state has not changed. The predetermined time period T is a short period of time during which the surrounding state of the microphone 123 can be regarded to have temporarily changed. The predetermined time period T is, for example, about one to five seconds (the same applies hereinafter).

Figure 8:
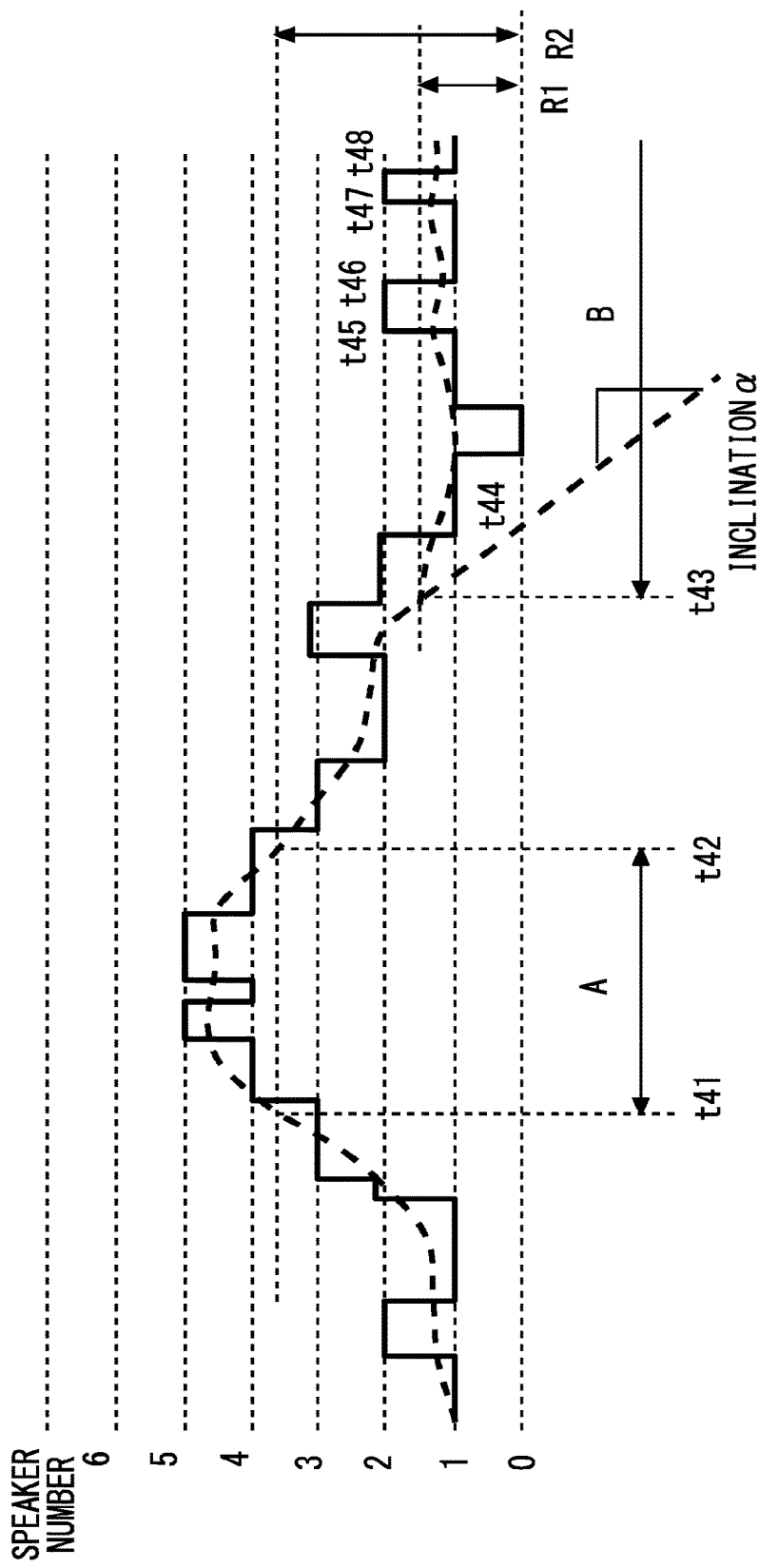
FIG. 8 is a graph showing examples of a moving average speaker number and the speaker number determined by the speaker number determination unit in the first embodiment.

FIG. 8 is a graph showing examples of the moving average speaker number and the speaker number determined by the speaker number determination unit 124. An example in which the control terminal 305 controls the volume of the loudspeaker 122 will be described with reference to FIG. 8. In FIG. 8, the horizontal axis represents time and the vertical axis represents the speaker number. A graph indicated by a solid line in FIG. 8 represents a transit of the number of speakers around the microphone 12 at a specific time. The speaker number determination unit 124 outputs data on the graph indicated by the solid line to the control terminal 305 as the determination result.

The graph indicated by a dotted line in FIG. 8 represents the moving average speaker number that is calculated by the speaker number determination unit 124 in consideration of the speaker number at a time prior to a target time. The speaker number determination unit 124 also outputs data on the graph indicated by the dotted line to the control terminal 305 as the determination result.

Referring to FIG. 8, during a period A (i.e., a period from a time t41 to a time t42), the moving average speaker number exceeds the third threshold R2, and the inclination of the moving average speaker number is equal to or more than the sixth threshold R3'. Accordingly, in the process flow shown in FIG. 7 described above, the control terminal 305 executes the determinations in steps S1-S3-S6, and determines the surrounding state to be the state (state "a") where a number of people are having a conversation (step S7).

At this time, the control terminal 305 controls the volume of the loudspeaker 122 to be turned up (for example, 70 dB). In other words, the control terminal 305 does not turn down the volume of the loudspeaker 122. This is because, since the people around the loudspeaker 122 are having a conversation, it is considered that the voice from the loudspeaker 122 does not disturb the people around the loudspeaker 122 even if the volume of the loudspeaker 122 is not turned down. On the contrary, if the control terminal 305 turns down the volume of the loudspeaker 122, the voice from the loudspeaker 122 is extremely small compared to the surrounding voice, so that the voice cannot reach a person with whom the robot 100 is having a conversation (i.e., a person with whom the remote operator of the robot 100 is having a conversation). Accordingly, the control terminal 305 controls the initially-set volume of the loudspeaker 122 to be turned up during the period A.

As shown in FIG. 8, at a time t43, the moving average speaker number is less than the first threshold R1 and the inclination α (α<0) of the moving average speaker number is less than the fifth threshold R3. In view of this, the control terminal 305 executes the determination in step Si and determines that the surrounding state of the microphone 123 has shifted from the state (state "b") where a small number of people are having a conversation to the state (state "c") where a specific person is making a speech, for example (step S2). Based on this determination, the control terminal 305 controls the volume of the loudspeaker 122 to be turned down (for example, the volume is turned down to 50 dB). It is considered that this state immediately shifts to the state where a speech is about to start. This is because it is considered that the control terminal 305 should control the volume of the loudspeaker to be turned down in advance so as to deal with an immediate shift of the surrounding state to a quiet surrounding environment.

Also after the time t43, the moving average speaker number of people around the robot is equal to or less than the first threshold R1. From that time, the control terminal 305 determines the surrounding state to be the state (state "c") where a specific person is making a speech, for example. Accordingly, the control terminal 305 controls the volume of the loudspeaker 122 to be maintained at a low level.

In the manner as described above, the control terminal 305 controls the volume of the loudspeaker 122 to be turned down during a period B after the time t43.

When the control terminal 305 determines the surrounding state of the microphone 123 to be the state "b", the control terminal 305 controls the volume of the loudspeaker 122 to be set to a medium level (for example, the volume is set to 60 dB). Thus, the control terminal 305 controls the volume of the loudspeaker 122 to be gradually increased in the order of the state "a", the state "b", and the state "c" of the surrounding state of the microphone 123.

The control terminal 305 may execute the determination process shown in FIG. 7 based not on the moving average speaker number calculated by the speaker number determination unit 124, but on the current number of speakers around the microphone 123 which is determined by the speaker number determination unit 124. In this case, the number of speakers around the microphone 123 is two (i.e., equal to or more than the first threshold R1) during a period from a time t45 to a time t46 and a period from a time t47 to a time t48 in the period B shown in FIG. 8. However, each of the period from the time t45 to the time t46 and the period from the time t47 to the time t48 is less than the predetermined time period T. Accordingly, the control terminal 305 determines that the state (state "c") where a specific person is making a speech has not changed. Therefore, the control terminal 305 controls the volume of the loudspeaker 122 to be maintained at a low level during the period B, instead of returning the volume to the original volume.

However, even if the current number of speakers around the microphone 123 changes only for a short period of time when the control terminal 305 executes the determination process shown in FIG. 7 based on the moving average speaker number, the state is determined while the change is alleviated. In other words, the state around the microphone 123 that is determined by the control terminal 305 can be prevented from being frequently switched. Accordingly, in order to prevent frequent change of the control of the volume of the microphone 123 by the control terminal 305, it is desirable that the control terminal 305 execute the determination process shown in FIG. 7 based on the moving average speaker number.

The communication system 10 according to the first embodiment described above can change the volume depending on the surrounding environment. The communication system 10 includes at least the microphone 123, the loudspeaker 122, the loudspeaker 303, the microphone 301, the speaker number determination unit 124, and the control terminal 305. The microphone 123 acquires a surrounding voice as a voice signal. The loudspeaker 122 is provided near the microphone 123 (for example, at a distance of about several tens of centimeters to one meter from the microphone 123), and outputs the voice. The loudspeaker 303 acquires the voice signal from the microphone 123, and outputs the acquired voice signal as a voice. The microphone 301 acquires a surrounding voice as a voice signal, and outputs the acquired voice signal to the loudspeaker 122. The speaker number determination unit 124 determines the number of speakers around the microphone 123 (for example, the number of speakers located within a radius of a several-meter from the microphone 123) based on the voice signal acquired by the microphone 123. The control terminal 305 controls the volume of the loudspeaker 122 based on the determination of the speaker number determination unit 124. With this configuration, the communication system 10 can control the volume of the loudspeaker 122 according to the number of speakers around the microphone 123. Accordingly, the communication system 10 can change the sound volume of communication depending on the environment around the microphone 123.

Figure 9:
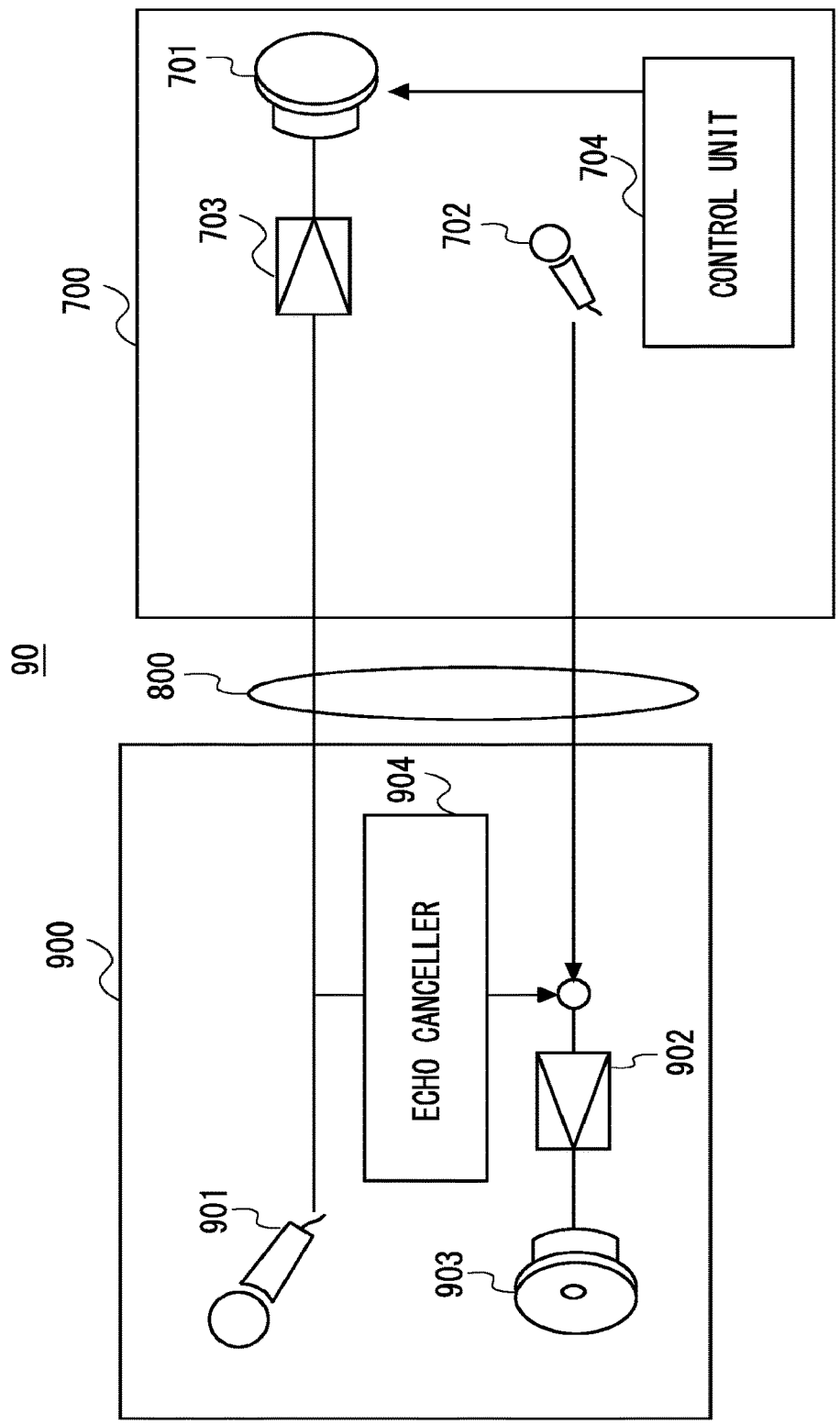
FIG. 9 is a configuration diagram showing a communication system of the related art.

FIG. 9 is a configuration diagram showing the configuration of a communication system of the related art. A communication system 90 shown in FIG. 9 includes a robot 700, a network 800, and a remote control side 900. The robot 700 is connected to the remote control side 900 via the network 800.

The robot 700 includes a speaker 701, a microphone 702, an amplifier 703, and a control unit 704. The speaker 701, the microphone 702, and the amplifier 703 respectively correspond to the loudspeaker 122, the microphone 123, and the amplifier 127 shown in FIG. 4. The control unit 704 executes the control of the loudspeaker 122 and the microphone 123.

The remote control side 900 includes a microphone 901, an amplifier 902, a speaker 903, and an echo canceller 904. The microphone 901, the amplifier 902, the speaker 903, and the echo canceller 904 respectively correspond to the microphone 301, the amplifier 302, the loudspeaker 303, and the echo canceller 304 shown in FIG. 4.

In the communication system 90, the remote operator on the remote control side 900 listens to the voice acquired by the microphone 702, which is located at a distance from the remote control side, with the speaker 903. When the remote operator directs his/her voice to the microphone 901, his/her own voice is output from the speaker 701 which is located at a distance from the remote control side. Thus, the remote operator can have a conversation with a person who is located at a distance from the remote control side (i.e., a person located near the robot 700).

However, it has been difficult for the remote operator to accurately recognize the environment around the robot 700. Specifically, it has been difficult for the remote operator to recognize the state of people around the robot 700, such as a state where the people are currently having a conversation, or a state where the people are quietly listening to a speech or the like made by any other person. As a result, if the remote operator speaks to a person near the robot 700 with the microphone 901 during the period in which the people around the robot are quietly listening to someone's speech, for example, a loud voice is output from the speaker 7, which may ruin the ambient atmosphere.

On the other hand, the communication system 10 according to the first embodiment changes the sound volume of communication depending on the environment around the microphone 123.

When the number of speakers around the microphone 123 that is determined by the speaker number determination unit 124 is less than the threshold, the control terminal 305 may control the volume of the loudspeaker 122 to be lower than that when the number of people is equal to or more than the threshold (in this case, the number of speakers around the microphone may be the current number of speakers around the microphone 123 that is determined by the speaker number determination unit 124, or may be the moving average speaker number calculated by the speaker number determination unit 124. The same applies hereinafter.). With this configuration, when the number of speakers around the microphone 123 is less than the threshold, the volume of the voice output from the loudspeaker 122, which is located near the microphone 123, is turned down. Therefore, the communication system 10 can prevent a speech being made around the loudspeaker 122 from being disturbed.

When the number of speakers around the microphone 123 that is determined by the speaker number determination unit 124 is less than the threshold, the control terminal 305 may control the volume of the loudspeaker 122 to be maintained at a low level even when the number of people becomes equal to or more than the threshold for only a period of time less than the predetermined time period T. With this configuration, in the case where a speech is made around the microphone 123, the control terminal 305 can control the volume of the loudspeaker 122 to be maintained at a low level even if a number of people speak for only a short period of time. Therefore, the communication system 10 can prevent a speech being made around the loudspeaker 122 from being disturbed.

When the number of speakers around the microphone 123 is equal to or more than the threshold, the control terminal 305 may control the volume of the loudspeaker 122 to be maintained at a high level even if the number of speakers becomes less than the threshold only for a period of time less than the predetermined time period T. With this configuration, the control terminal 305 can control the volume of the loudspeaker 122 to be maintained at the same level even if the people become quiet for only a short period of time when a number of people are having a conversation around the microphone 123. Accordingly, the communication system 10 prevents the communication of the person (remote operator), who speaks using the loudspeaker 303 and the microphone 301, from being disturbed by turning down the volume of the loudspeaker 122.

When the number of speakers around the microphone 123 that is determined by the speaker number determination unit 124 decreases by more than a predetermined number within a specific time period (i.e., when the inclination α is less than a predetermined inclination), the control terminal 305 may control the volume of the loudspeaker 122 to be turned down. With this configuration, the control terminal 305 detects that the surrounding state of the microphone 123 has changed from the state where a number of people are having a conversation to the state where the audience is quietly waiting for a speech to start, and thereby the control terminal 305 can control the volume of the loudspeaker 122 to be turned down. Thus, the communication system 10 can prevent a speech being made around the loudspeaker 122 from been disturbed.

The control terminal 305 may control the volume of the loudspeaker 122 to be turned down when the number of speakers around the microphone 123 that is determined by the speaker number determination unit 124 is equal to or less than the threshold and is decreasing. With this configuration, the control terminal 305 can detect the state where the audience is quietly waiting for a speech to start, as the surrounding state of the microphone 123, and can turn down the volume of the loudspeaker 122. Thus, the communication system 10 can prevent a speech being made around the loudspeaker 122 from being disturbed.

Instead of the control terminal 305, the control unit 125 of the robot 100 may execute the process flow shown in FIG. 7. In this case, the robot 100 is a robot that communicates with a human by using a voice, and includes the loudspeaker 122, the microphone 123, the speaker number determination unit 124, and the control unit 125.

Figure 10:
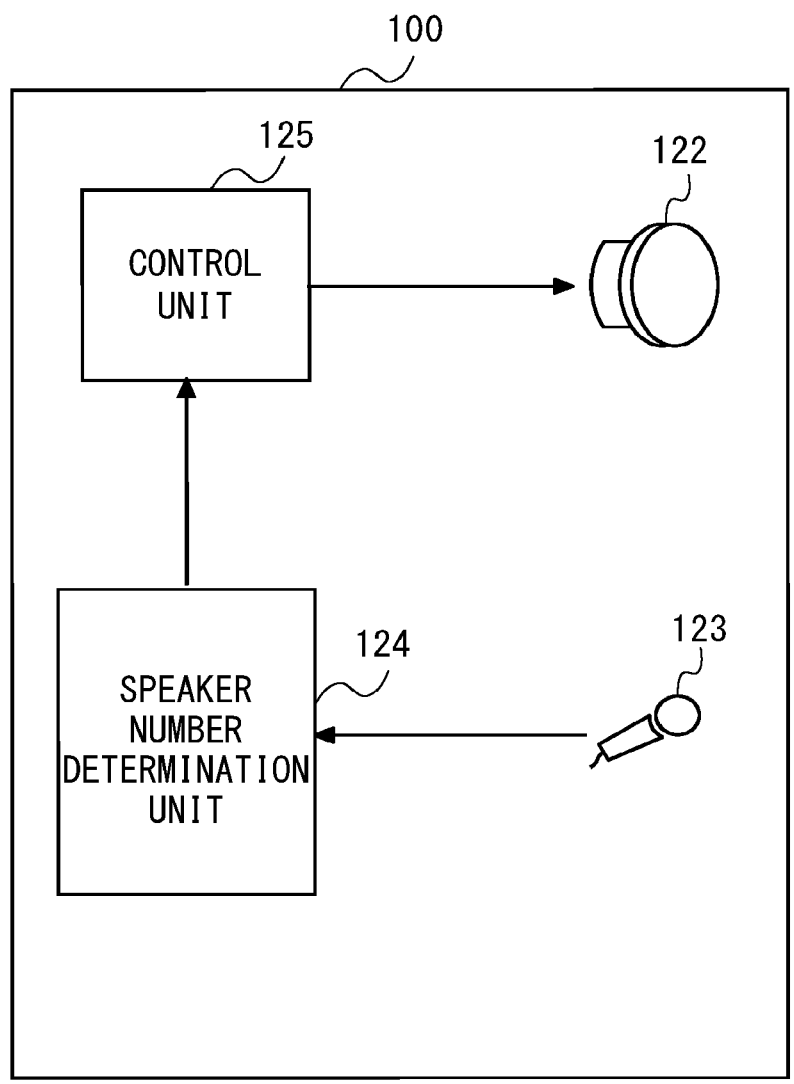
FIG. 10 is a block diagram showing an example of a process for the robot according to the first embodiment.

FIG. 10 is a block diagram showing an example of processing of the robot. The loudspeaker 122 outputs a voice. The microphone 123 acquires the surrounding voice of the robot 100 as a voice signal. The speaker number determination unit 124 determines the number of speakers around the robot 100 based on the voice signal acquired by the microphone 123. The control unit 125 controls the volume of the loudspeaker 122 based on the determination of the speaker number determination unit 124. This configuration enables the robot 100 to control the volume of the loudspeaker 122 according to the number of speakers around the robot. Therefore, the robot 100 can autonomously change the sound volume of communication depending on the surrounding environment.

The first embodiment also discloses a volume control method for a communication system. This communication system includes: the microphone 123 that acquires a surrounding voice as a voice signal; the loudspeaker 122 that is provided near the microphone 123 and outputs a voice; the loudspeaker 303 that acquires the voice signal from the microphone 123 and outputs the acquired voice signal as a voice; and the microphone 301 that acquires a surrounding voice as a voice signal and outputs the acquired voice signal to the speaker. This volume control method includes at least the following steps:

(a) determining the number of speakers around the microphone 123 based on the voice signal acquired by the microphone 123; and (b) controlling the volume of the loudspeaker 122 based on the determination. With this configuration, the communication system can control the volume of the loudspeaker 122 according to the number of speakers around the microphone 123. Accordingly, the communication system can change the sound volume of communication depending on the environment around the loudspeaker 122.

The processing method shown in the flowchart of FIG. 7 is illustrated by way of example only. In FIG. 7, for example, the control terminal 305 may first execute the determination in step S1, instead of step S3. Also, the values of the first threshold R1, the second threshold R1', the third threshold R2, and the fourth threshold R2' are illustrated by way of example only. Any value may be used as long as the magnitude relation of R1<R1'<R2<R2' is satisfied. The values of the fifth threshold R3 and the sixth threshold R3' can also be changed based on the values of the first threshold R1 to the fourth threshold R2'.

In the processing example described above, the control terminal 305 sets the volume of the loudspeaker 122 to 70 dB when the surrounding state of the microphone 123 corresponds to the state "a". In this case, when the surrounding state of the microphone 123 corresponds to the state "a", it is not necessary to maintain the volume of the loudspeaker 122 at a volume of 70 dB. Alternatively, the control terminal 305 may adjust the volume of the loudspeaker 122 so that the volume of the loudspeaker 122 is slightly changed (for example, about 1-2 dB). The same applies when the surrounding state of the microphone 123 corresponds to the state "b" or the state "c". Also in this case, the control terminal 305 may control the volume of the loudspeaker 122 to be gradually increased in the order of the state "a", the state "b", and the state "c" of the surrounding state of the microphone 123.

When the surrounding state of the microphone 123 corresponds to the state "b", the control terminal 305 may set the volume of the loudspeaker 122 at the same level as that when the surrounding state of the microphone 123 corresponds to the state "a".

The control terminal 305 may determine the above-mentioned states "a", "b", and "c" by a method other than the method described above. The states "a", "b", and "c" will be sequentially described below.

For example, when the control terminal 305 detects the following state, the control terminal 305 can determine the surrounding state of the microphone 123 to be the state "a". The control terminal 305 can determine the surrounding state of the microphone 123 to be the state "a", when it is determined that there are a number of speakers who speak in a loud voice at a volume equal to or higher than a predetermined level, or who speak in a normal voice volume, around the microphone 123 and that the voice has continued for a certain period of time or more.

The term "a volume equal to or higher than a predetermined level" herein used refers to a volume of about 70 to 80 dB, for example, which is a volume of a loud voice, and the term "normal volume" herein used refers to a volume of about 60 dB, for example, which is a voice of a normal speaking voice (the same applies hereinafter). The term "certain period of time" refers to a period of time long enough to specify the surrounding state of the microphone 123, and the certain period of time is, for example, about 7 to 10 seconds (the same applies hereinafter). This period of time is set so as to avoid determining a laughing voice or a speaking voice, which sometimes occurs for about a few seconds during a speech, to be the state where "a number of people are having a conversation". "A number of speakers" indicate a case where, for example, there are four or more speakers (equal to or more than the above-mentioned third threshold R2).

Further, in the case where the surrounding state of the microphone 123 is determined to be the state "a" as described above, the control terminal 305 may determine the surrounding state of the microphone 123 to be the state "a" even when the above-mentioned conditions are not met for only a period of time less than the predetermined time period T. This is because, since the people may become quiet for a moment without making any conversation even in the state where a number of people have a conversation, if such a state is determined to be the state "b" or the state "c", the volume of the loudspeaker cannot be accurately controlled based on the actual state. As described above, the predetermined time period T is, for example, about one to five seconds.

The control terminal 305 may determine the surrounding state of the microphone 123 to be the state "a", not only when the number of speakers around the microphone 123 at a certain time is equal to or more than the third threshold R2, but also when the number of individual speakers around the microphone 123 within a certain period of time is more than a predetermined number. The definition of a certain period of time is described above.

For example, when five or more speakers are around the microphone 123 for 10 seconds, the control terminal 305 can determine the surrounding state of the microphone 123 to be the state "a". In this case, for example, when, for 10 seconds, the person A, the person B, and the person C have a conversation first and then the person A, the person D, and the person E have a conversation, the speaker number determination unit 124 determines that five people are around the microphone 123. The speaker number determination unit 124 detects different characteristic vibrations as described above, thereby determining which of the persons A to E have had a conversation.

In this case, it is taken into consideration that even in the case where a number of people have a conversation around the microphone 123, the people are not always talking, but may stop talking for a moment. In a case where the conversation is interrupted for a short period of time (for example, 1 to 3 seconds), if the control terminal 305 determines the surrounding state of the microphone 123 to be the state "b" or the state "c", only by taking into consideration the state within such a short period of time, the volume of the loudspeaker cannot be accurately controlled based on the actual state. However, even in the case where the conversation is interrupted, the control terminal 305 determines the surrounding state of the microphone 123 to be the state "a" when the number of individual speakers around the microphone 123 within a certain period of time is more than the predetermined number. Accordingly, the control terminal 305 can accurately determine the surrounding state of the microphone 123.

Furthermore, according to this determination method, the state can be accurately determined especially when a certain speaker talks with different people during a conversation.

For example, when, for 10 seconds, the person A, the person B, and the person C have a conversation first and then the person A, the person D, and the person E have a conversation, the speaker number at a specific time is three, that is, less than the third threshold R2, while the number of individual speakers within a certain period of time is five, that is, equal to or more than the third threshold R2. At this time, if the control terminal 305 determines the surrounding state of the microphone 123 to be the state "b", only by taking into consideration the state at a specific time, the volume of the loudspeaker cannot be accurately controlled based on the actual state. However, even in the case where the speaker number at a specific time is small, the control terminal 305 determines the surrounding state of the microphone 123 to be the state "a" when the number of individual speakers around the microphone 123 within a certain period of time is more than the predetermined number. Accordingly, the control terminal 305 can accurately determine the surrounding state of the microphone 123.

When the control terminal 305 detects the following state, the control terminal 305 can determine the surrounding state of the microphone 123 to be the state "b". When the number of speakers who speak in a loud voice at a volume equal to or higher than a predetermined level, or who speak in a normal voice volume, around the microphone 123 has decreased by more than the predetermined number or more within a specific time period, the control terminal 305 may determine the surrounding state of the microphone 123 to be the state "b". Examples of "volume equal to or higher than the predetermined level" and "normal volume" are described above.

When the number of speakers who speak in a normal speaking voice has decreased by four or more people within three seconds, for example, the control terminal 305 can determine that the surrounding state of the microphone 123 has shifted from the state "a" to the state "b".

Thus, when the number of speakers who speak in a loud voice at a volume equal to or higher than the predetermined level, or who speak in a normal voice volume, has abruptly decreased within a short period of time, the control terminal 305 can determine the surrounding state of the microphone 123 to be the state "b". This state indicates that the surrounding state has shifted from the state where a number of people are having a conversation around the microphone 123 to the state where the people stop the conversation when a speech is about to start.

When the speaker number has decreased by the predetermined number or more within a certain period of time in the state where the number of speakers who speak in a loud voice at a volume equal to or higher than the predetermined level, or who speak in a normal voice volume, around the microphone 123 is equal to or less than the predetermined number, the control terminal 305 can determine that the surrounding state of the microphone 123 has shifted from the state "a" to the state "b". For example, when the number of speakers who speak in a normal speaking voice is equal to or less than 10 at a specific time, and when the number of speakers has decreased by four or more people within 10 seconds, the control terminal 305 can determine that the surrounding state of the microphone 123 has shifted from the state "a" to the state "b". Thus, the control terminal 305 can determine the surrounding state of the microphone 123 to be the state "b" when the number of speakers who speak in a loud voice at a volume equal to or higher than the predetermined level, or who speak in a normal voice volume, is equal to or less than the predetermined number and when the number of speakers is further decreasing. This state indicates that the surrounding state has shifted from the state where a small number of people are having a conversation to the state where the people gradually become quiet and stop the conversation when a speech is about to start.

Further, when the control terminal 305 detects the following state, the control terminal 305 can determine the surrounding state of the microphone 123 to be the state "c". When a small number of (about one to three) speakers speak in a loud voice at a volume equal to or higher than the predetermined level for a certain period of time or more around the microphone 123, the control terminal 305 can determine the surrounding state of the microphone 123 to be the state "c". This indicates a state where a small number of people are making a speech around the microphone 123. The number of people who make a speech is not limited to one. A small number of people, such as two or three people, may make a speech. This is because there are some cases where a host and a guest talk in, for example, a ceremonial hall.

At this time, the speaker number determination unit 124 may count the number of speakers who speak in a voice volume lower than the above-mentioned certain level, as the number of "speakers who speak at a volume lower than a certain level". The control terminal 305 can determine the surrounding state of the microphone 123 to be the state "c", even when the speaker number determination unit 124 determines that there is a speaker who speaks at a volume lower than the certain level around the microphone 123. The term "volume lower than the certain level" refers to a volume of a small voice, such as a whispering voice, and the volume lower than the certain level is, for example, about 30 to 40 dB. This indicates a state where a small number of people are making a speech around the microphone 123, while other people are talking in a small voice so as not to disturb the speech.

Further, the control terminal 305 can determine the surrounding state of the microphone 123 to be the state "c", even when the number of speakers who speak in a loud voice at a volume equal to or higher than the predetermined level, or who speak in a normal voice volume, for a period of time less than the predetermined time period T (for example, a time period equal to or more than three seconds and less than five seconds). This process is intended to prevent the control terminal 305 from determining the surrounding state to be the state where a number of people are having a conversation, merely by detecting a laughing voice or a conversation during a period in which a speech is made, and from controlling the volume of the loudspeaker 122 by a method that is not appropriate for the actual state.

Further, the control terminal 305 can determine the surrounding state of the microphone 123 to be the state "c", even when there is no speaker who speaks in a loud voice at a volume equal to or higher than the predetermined level for a period of time less than the predetermined time period T (for example, a time period less than two to five seconds). This process is intended to prevent the control terminal 305 from determining the surrounding state to be the state "b", merely by detecting a short break during a speech made by a person, and from controlling the volume of the loudspeaker 122 by a method that is not appropriate for the actual state.

Further, the control terminal 305 can determine the surrounding state of the microphone 123 to be the state "c", even when the state "a" where there are a large number of speakers has shifted to the state where the number of speakers has decreased (for example, two or three people). This indicates a state where when the surrounding state of the microphone 123 has changed from the state where the audience is having a conversation to the state where a speech is about to start, a small number of people who have not noticed that the speech is about start are having a conversation. Accordingly, the control terminal 305 can control the volume of the loudspeaker 122 to be turned down, while appropriately reflecting the actual state.

As described above, the control terminal 305 can control the volume of the loudspeaker 122 based on the number of speakers within a certain period of time that is determined by the speaker number determination unit 124, not on the number of speakers at a specific time. Thus, even if the speaker number has changed only during a short period of time, the control terminal 305 can accurately determine the surrounding state of the microphone 123, regardless of the change of the state. Therefore, the communication system can change the sound volume of communication with a high accuracy depending on the environment around the first microphone.

Furthermore, the speaker number determination unit 124 may count the number of individuals having a conversation within a certain period of time, as the number of speakers around the microphone 123 within a certain period of time. This enables the speaker number determination unit 124 to accurately recognize the total number of people having a conversation in a case where different people are having conversations at different times. Accordingly, the control terminal 305 can accurately determine the surrounding state of the microphone 123.

Second Embodiment

A second embodiment of the present invention will be described below with reference to the drawings. The appearance of a robot and the configuration of the head of the robot according to the second embodiment are similar to those of the first embodiment, and thus the description thereof is omitted.

Figure 11:
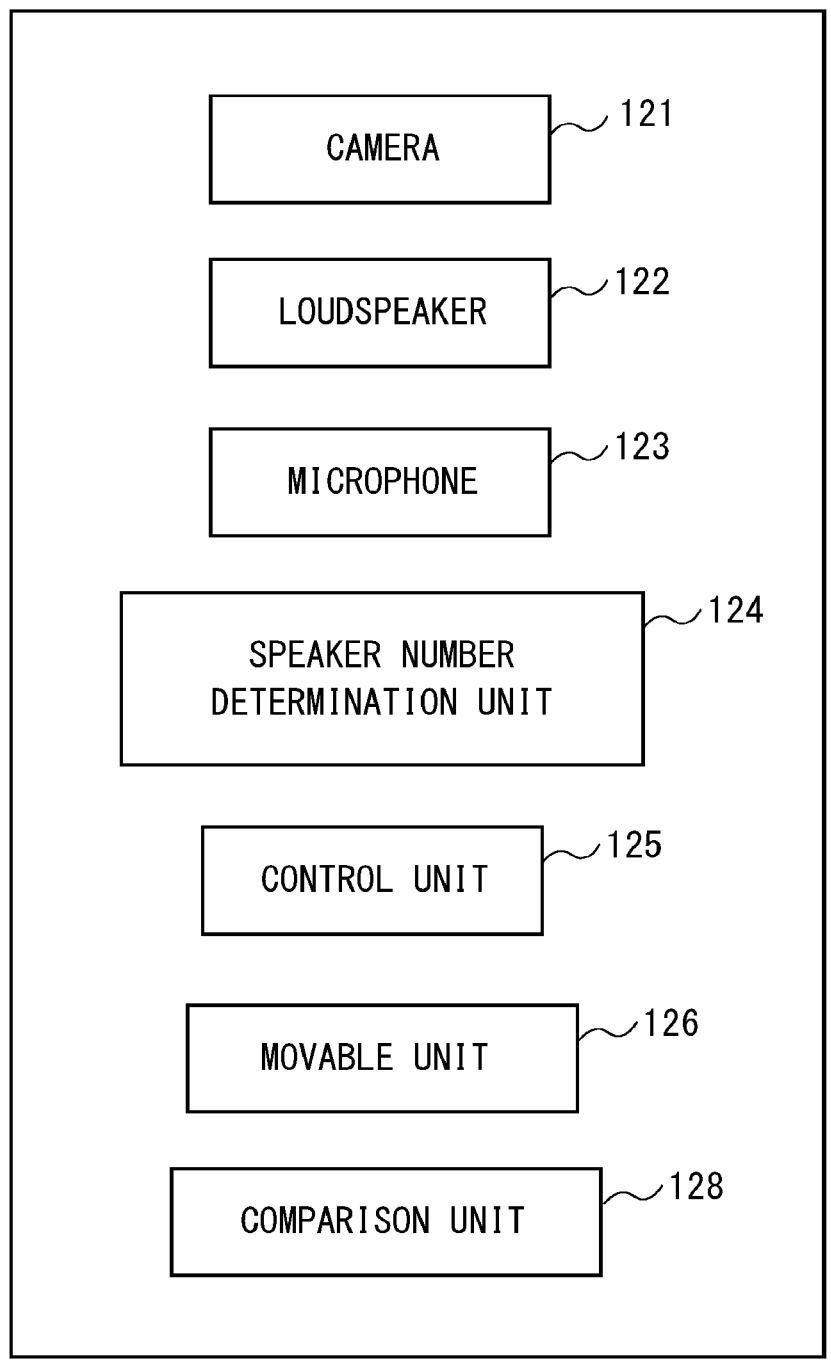
FIG. 11 is a block diagram showing an example of internal components of a robot according to a second embodiment.

FIG. 11 is a block diagram showing an example of internal components of the robot 100 according to the second embodiment. The robot 100 shown in FIG. 11 further includes a comparison unit 128, as compared with the robot 100 shown in FIG. 3.

Figure 12:
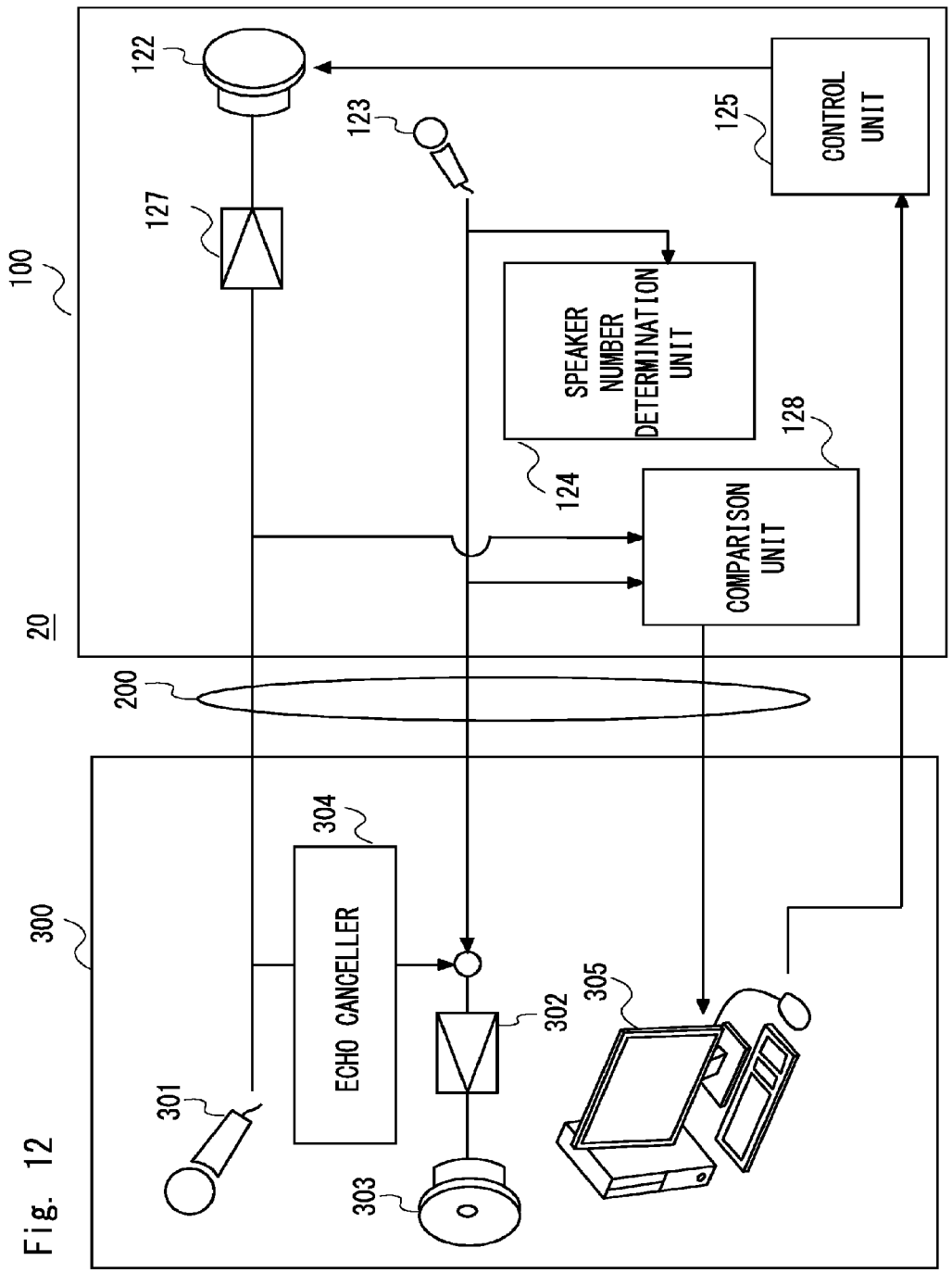
FIG. 12 is a configuration diagram showing an example of a communication system including the robot according to the second embodiment.

FIG. 12 is a configuration diagram showing an example of a communication system including the robot 100. In a communication system 20, the comparison unit 128 compares a voice signal output from the microphone 301 with a voice signal output from the microphone 123, thereby comparing the loudness of a voice output from the loudspeaker 122 with the loudness of a voice around the microphone 123. In other words, the comparison unit 128 compares the loudness of a voice output from the robot 100 with the loudness of a voice emitted from people around the robot 100.

The comparison unit 128 outputs the comparison result to the control terminal 305, and the control terminal 305 displays the comparison result. The remote operator controls the volume of the loudspeaker 122 from the control terminal 305 based on the comparison result displayed on the control terminal 305. Accordingly, the communication system 30 can control the volume of the loudspeaker 122 according to the loudness of the surrounding voice of the loudspeaker 122.

For example, the comparison unit 128 determines that the volume of the voice output from the loudspeaker 122 is 65 dB and that the volume of the voice acquired from the microphone 123 is 55 dB. At this time, the remote operator determines where the voice output from the robot 100 is larger than the surrounding voice of the robot 100 (i.e., a state where the robot 100 speaks with a louder voice than the surrounding people). According to the determination, the remote operator outputs the control signal from the control terminal 305 to the control unit 125 so that the volume of the loudspeaker is turned down by about 10 dB. Accordingly, the comparison unit 128 can turn down the volume of the loudspeaker 122 in accordance with the volume of the surrounding voice of the robot.

Meanwhile, the comparison unit 128 determines that the volume of the voice output from the loudspeaker 122 is 50 dB and the volume of the voice acquired from the microphone 123 is 60 dB. At this time, the remote operator determines that the voice output from the robot 100 is smaller than the surrounding voice of the robot 100 (i.e., in a state where the surrounding people can hardly hear the voice of the robot 100). According to the determination, the remote operator outputs the control signal from the control terminal 305 to the control unit 125 so that the volume of the loudspeaker 122 is turned up by about 10 dB. Accordingly, the comparison unit 128 can turn up the volume of the loudspeaker 122 in accordance with the volume of the surrounding voice of the robot.

Since the remote operator is located at a distance from the robot 100, the remote operator cannot directly hear the voice output from the robot 100 and the voice emitted from the people around the robot 100. Accordingly, there is a possibility that the remote operator incorrectly sets the volume of the voice output from the robot 100. For example, the volume of the voice output from the robot 100 may be extremely large compared to the volume of the voice emitted from the people around the robot 100, with the result that the voice of the robot 100 may disturb the conversation or speech made by the people around the robot 100. On the other hand, the volume of the voice output from the robot 100 may be extremely small compared to the volume of the voice emitted from the people around the robot 100, which may make it difficult for the people around the robot 100 to have a conversation with the remote operator through the robot 100. The robot 100 and the communication system 30 according to the second embodiment solve this problem by controlling the volume of the voice output from the robot 100 so as to match the volume of the voice emitted from the people around the robot 100.

The control unit 125 may automatically control the volume of the loudspeaker 122 based on the comparison result of the comparison unit 128. A specific control method of the control unit 125 is described above. Specifically, the control unit 125 controls the volume of the loudspeaker 122 based on the comparison result of the comparison unit 128 so that the volume of the voice output from the loudspeaker 122 becomes substantially the same as the volume of the voice acquired from the microphone 123.

Third Embodiment

A second embodiment of the present invention will be described below with reference to the drawings. The appearance of a robot and the configuration of the head of the robot according to the third embodiment are the same as those of the first embodiment, and thus the description thereof is omitted.

Figure 13:
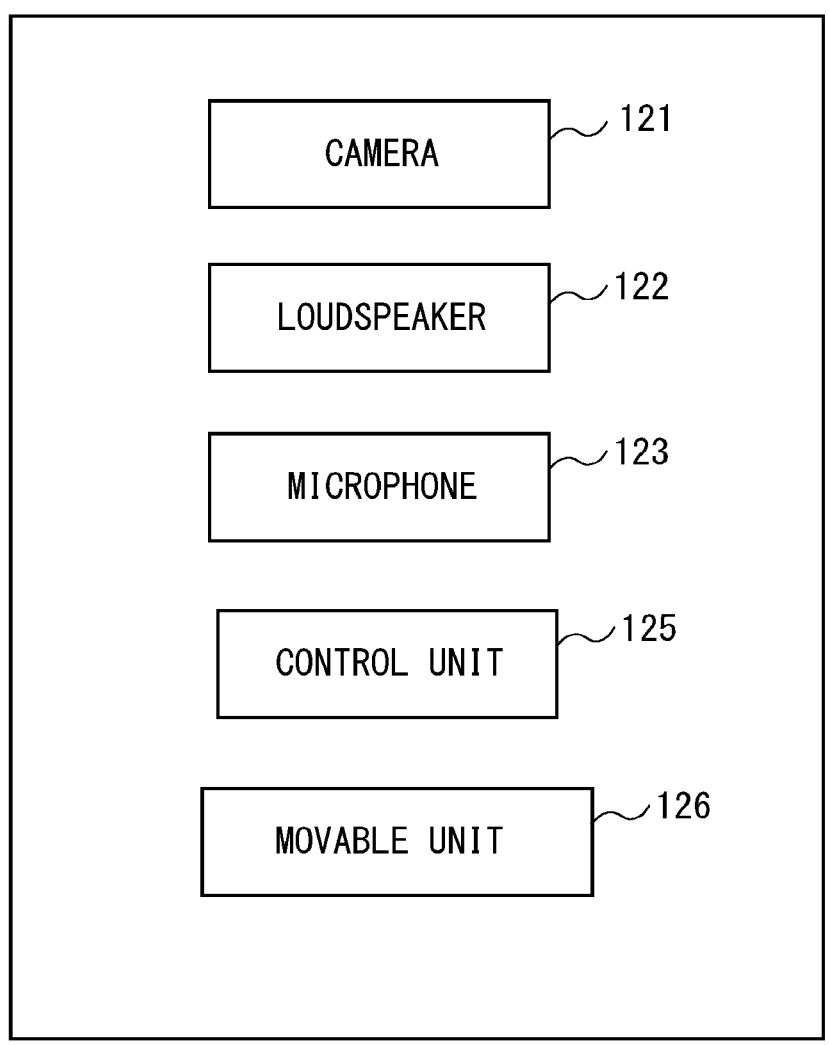
FIG. 13 is a block diagram showing an example of internal components of a robot according to a third embodiment.

FIG. 13 is a block diagram showing an example of internal components of the robot 100 according to the third embodiment. Unlike the robot 100 shown in FIG. 3, the robot 100 shown in FIG. 13 does not include the speaker number determination unit 124.

Figure 14:
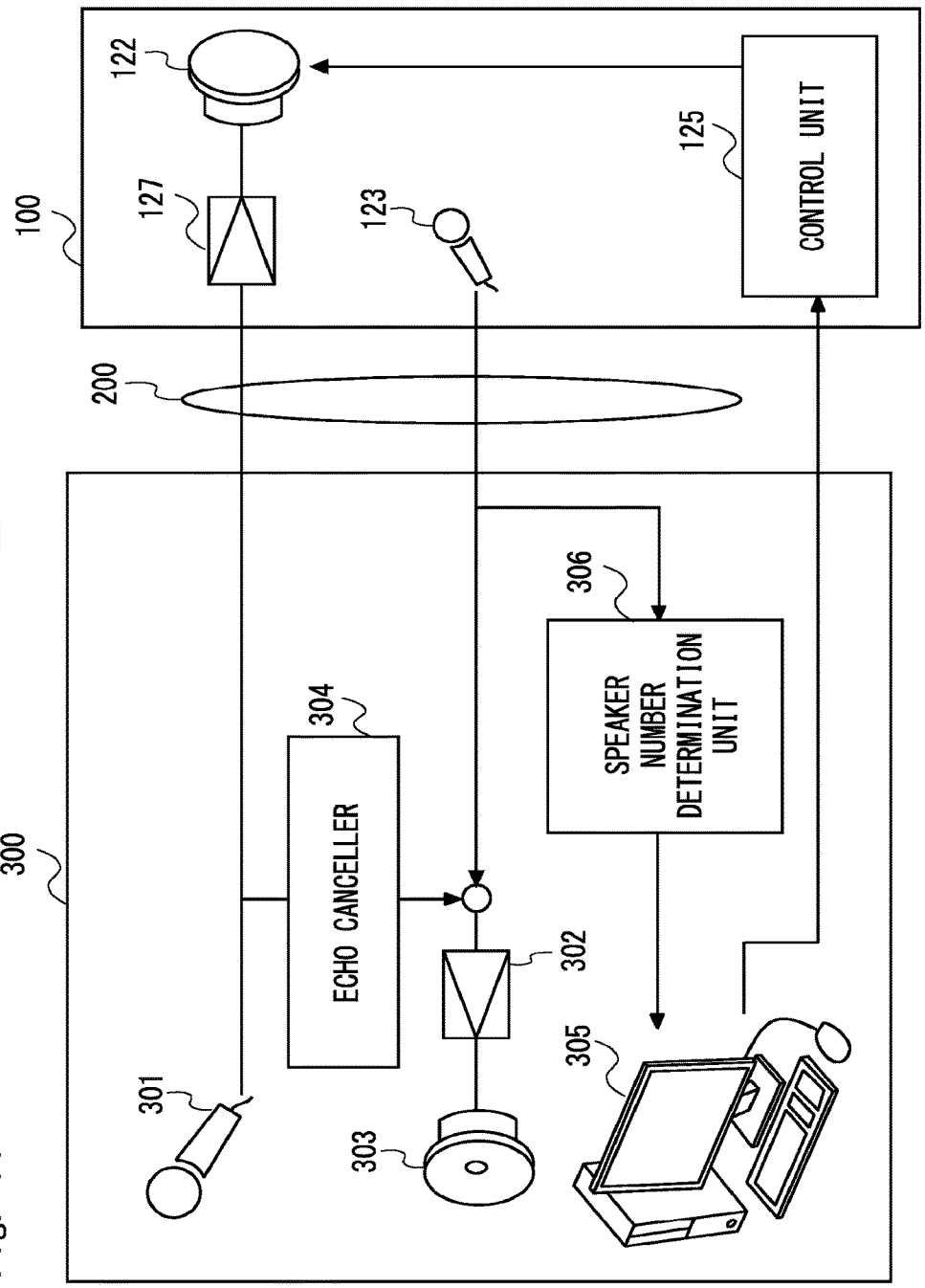
FIG. 14 is a configuration diagram showing an example of a communication system including the robot according to the third embodiment.

FIG. 14 is a configuration diagram showing an example of a communication system including the robot 100. In a communication system 30, a speaker number determination unit 306 serving as the speaker number determination unit is included in the remote control side 300. Processing executed by the speaker number determination unit 306 is similar to that of the speaker number determination unit 124 according to the first embodiment, and thus the description thereof is omitted. The speaker number determination unit 306 outputs the determination result to the control terminal 305.

The control terminal 305 outputs a control signal to the control unit 125 so as to control the volume of the loudspeaker 122 based on the determination result. The method for controlling the volume of the loudspeaker 122 by the control terminal 305 is the same as the method described in the first embodiment. The control unit 125 controls the volume of the loudspeaker 122 based on the control signal.

As described above, in the third embodiment, the speaker number determination unit 306 is included not in the robot 100, but in the remote control side 300. This is a configuration for suppressing the effect of a delay that occurs in the network 200 when the determination result is output to the control terminal 305 in the case where the speaker number determination unit 306 is included in the robot 100. The speaker number determination unit 306 executes a determination using a voice signal which is output from the microphone 123 and is not yet subjected to echo cancellation by the echo canceller 304.

Like the speaker number determination unit 306 shown in FIG. 14, the comparison unit 128 according to the second embodiment may be included not in the robot 100, but in the remote control side 300.

Note that the present invention is not limited to the above embodiments, and can be modified as appropriate without departing from the scope of the invention. For example, the robot 100 according to the first embodiment has been described above as a remote-controlled robot that is controlled by a remote operator. Alternatively, a robot that autonomously determines the surrounding state and outputs a voice or the like may also be used. Such a robot can also control the volume of the loudspeaker depending on the environment by a determination method similar to that of the first embodiment. Also in a case where a computer including the same components as those of the robot 100 is included in the communication system 10, instead of including the robot 100 in the communication system 10, the communication system 10 can obtain the same effects.

In the first embodiment, the speaker number determination unit 124 can calculate the transition of the number of speakers around the robot over time by executing another filter process, instead of calculating the moving average of the number of speakers around the robot. The control unit 125 controls the volume of the loudspeaker 122 in the same manner as in the first embodiment based on the data on the transition.

The process flow shown in the first embodiment can be executed by a computer (for example, a personal computer, a mobile terminal, or a robot) as a control method. For example, the process flow may be executed by a computer as a control program. This computer includes a loudspeaker that outputs a voice, and a microphone that acquires a surrounding voice as a voice signal. The computer determines the number of speakers around the robot based on the voice signal acquired by the microphone. Then, the computer controls the volume of the loudspeaker based on the determination. The computer executes the process in the manner as described above. The processes described in the second and third embodiments can also be executed by the computer in the same manner.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM, CD-R, CD-R/W, and semiconductor memories (such as mask ROM, PROM (Programmable ROM), EPROM (Erasable PROM), flash ROM, RAM (Random Access Memory), etc.). The program may be provided to a computer using any type of transitory computer readable media. Examples of transitory computer readable media include electric signals, optical signals, and electromagnetic waves. Transitory computer readable media can provide the program to a computer via a wired communication line, such as electric wires and optical fibers, or a wireless communication line.

This application is based upon and claims the benefit of priority from Japanese patent application No. 2013-059420, filed on Mar. 22, 2013, the disclosure of which is incorporated herein in its entirety by reference.

REFERENCE SIGNS LIST 10, 20, 30 COMMUNICATION SYSTEM
100 ROBOT
101 HEAD
102 BODY PART
103 RIGHT ARM PART
104 LEFT ARM PART
105 RIGHT LEG PART
106 LEFT LEG PART
111 RIGHT EYE
112 LEFT EYE
113 MOUTH
114 RIGHT EAR
115 LEFT EAR
121 CAMERA
122 LOUDSPEAKER
123 MICROPHONE
124 SPEAKER NUMBER DETERMINATION UNIT
125 CONTROL UNIT
126 MOVABLE UNIT
127 AMPLIFIER
128 COMPARATOR
200 NETWORK
300 REMOTE CONTROL SIDE
301 MICROPHONE
302 AMPLIFIER
303 LOUDSPEAKER
304 ECHO CANCELLER
305 CONTROL TERMINAL
306 SPEAKER NUMBER DETERMINATION UNIT

The invention claimed is:

1. A communication system comprising:
a robot including:
a first microphone that acquires a surrounding voice as a voice signal, and
a first loudspeaker that is provided near the first microphone and outputs a voice;
a remote control connected to the robot via a network and including:
a second loudspeaker that acquires the voice signal from the first microphone and outputs the acquired voice signal as a voice, and
a second microphone that acquires a surrounding voice as a voice signal, and outputs the acquired voice signal to the first loudspeaker;
a speaker number determination unit that determines a speaker number indicating a number of speakers around the first microphone, based on the voice signal acquired by the first microphone; and
a control unit that controls a volume of the first loudspeaker based on the determination of the speaker number determination unit,
a comparison unit that outputs a result of a comparison between a loudness of a voice acquired by the first microphone and a loudness of a voice acquired by the second microphone,
wherein the control unit controls the volume of the first loudspeaker based on a result of the comparison by the comparison unit,
wherein when the speaker number is less than a threshold, the control unit controls the volume of the first loudspeaker to be lower than that when the speaker number is equal to or more than the threshold, and
wherein when the speaker number is less than the threshold, the control unit controls the volume of the first loudspeaker to be maintained at a low level even when the speaker number becomes equal to or more than the threshold only for a time period less than a predetermined time period.

2. The communication system according to claim 1, wherein when the speaker number is equal to or more than the threshold, the control unit controls the volume of the first loudspeaker to be maintained at a high level even when the speaker number becomes less than the threshold only for the time period less than the predetermined time period.

3. The communication system according to claim 1, wherein the control unit controls the volume of the first loudspeaker to be turned down when the speaker number decreases by more than a predetermined number within a specific time period.

4. The communication system according to claim 1, wherein the control unit controls the volume of the first loudspeaker to be turned down when the speaker number is equal to or less than the threshold and is decreasing.

5. The communication system according to claim 1, wherein the control unit controls the volume of the first loudspeaker based on the speaker number within a certain period of time.

6. The communication system according to claim 5, wherein the speaker number determination unit counts, as the speaker number within a certain period of time, the number of individuals who have a conversation within the certain period of time.

7. The communication system according to claim 1, wherein the control unit controls the volume of the first loudspeaker according to a loudness of a surrounding voice of the first loudspeaker.

8. The communication system according to claim 7, wherein the control unit controls the volume of the first loudspeaker so that the volume of the first loudspeaker is turned down when the loudness of the voice acquired by the second microphone is larger than the loudness of the voice acquired by the first microphone.

9. The communication system according to claim 7, wherein the control unit controls the volume of the first loudspeaker so that the volume of the first loudspeaker is turned up when the loudness of the voice acquired by the first microphone is larger than the loudness of the voice acquired by the second microphone.

10. A robot that executes communication with a human by using a voice and that is connected to a remote control via a network, the robot comprising:
 a first loudspeaker that outputs a voice;
 a first microphone that acquires a voice around the robot as a voice signal;
 a speaker number determination unit that determines a speaker number indicating a number of speakers around the robot based on the voice signal acquired by the microphone; and
 a control unit that controls a volume of the first loudspeaker based on the determination of the speaker number determination unit,
 a comparison unit that outputs a result of a comparison between a loudness of a voice acquired by the first microphone and a loudness of a voice acquired by a second microphone,
 wherein
 the control unit further controls the volume of the first loudspeaker based on a result of the comparison by the comparison unit,
 when the speaker number is less than a threshold, the control unit controls the volume of the first loudspeaker to be lower than that when the speaker number is equal to or more than the threshold,
 when the speaker number is less than the threshold, the control unit controls the volume of the first loudspeaker to be maintained at a low level even when the speaker number becomes equal to or more than the threshold only for a time period less than a predetermined time period, and
 the remote control includes:
  a second loudspeaker that acquires the voice signal from the first microphone and outputs the acquired voice signal as a voice, and
  the second microphone acquires a surrounding voice as a voice signal, and outputs the acquired voice signal to the first loudspeaker.

11. A volume control method for a communication system, the communication system including:
 a first microphone installed in a robot that acquires a surrounding voice as a voice signal;
 a first loudspeaker installed in the robot that is provided near the first microphone and outputs a voice;
 a second loudspeaker installed in a remote control connected to the robot via a network that acquires the voice signal from the first microphone and outputs the acquired voice signal as a voice; and
 a second microphone installed in the remote control that acquires a surrounding voice as a voice signal and outputs the acquired voice signal to the first loudspeaker,
 the volume control method comprising the steps of:
  determining a speaker number indicating a number of speakers around the first microphone based on the voice signal acquired by the first microphone; and
  controlling a volume of the first loudspeaker based on the determination,
 comparing between a loudness of a voice acquired by the first microphone and a loudness of a voice acquired by the second microphone,
 further controlling the volume of the first loudspeaker based on a result of the comparison between the loudness of the voice acquired by the first microphone and the loudness of the voice acquired by the second microphone,
 wherein when the speaker number is less than a threshold, controlling the volume includes controlling the volume of the first loudspeaker to be lower than that when the speaker number is equal to or more than the threshold, and
 wherein when the speaker number is less than the threshold, controlling the volume includes controlling the volume of the first loudspeaker to be maintained at a low level even when the speaker number becomes equal to or more than the threshold only for a time period less than a predetermined time period.

12. A non-transitory computer readable medium storing a control program for a robot that is connected to a remote control via a network and includes: a first loudspeaker that outputs a voice; and a first microphone that acquires a surrounding voice as a voice signal, the control program causing the robot to execute the steps of:
 determining a speaker number indicating a number of speakers around the robot based on the voice signal acquired by the microphone; and
 controlling a volume of the first loudspeaker based on the determination,
 comparing between a loudness of a voice acquired by the first microphone and a loudness of a voice acquired by a second microphone,
 further controlling the volume of the first loudspeaker based on a result of the comparison between the loudness of the voice acquired by the first microphone and the loudness of the voice acquired by the second microphone, wherein
 when the speaker number is less than a threshold, controlling the volume includes controlling the volume of the first loudspeaker to be lower than that when the speaker number is equal to or more than the threshold,
 when the speaker number is less than the threshold, controlling the volume includes controlling the volume of the first loudspeaker to be maintained at a low level even when the speaker number becomes equal to or more than the threshold only for a time period less than a predetermined time period, and
 the remote control includes:
  a second loudspeaker that acquires the voice signal from the first microphone and outputs the acquired voice signal as a voice, and
  the second microphone acquires a surrounding voice as a voice signal, and outputs the acquired voice signal to the first loudspeaker.

* * * * *